US011606239B2

(12) United States Patent
Landis et al.

(10) Patent No.: US 11,606,239 B2
(45) Date of Patent: *Mar. 14, 2023

(54) NON-COHERENT WAVEFORMS FOR WIRELESS COMMUNICATION

(71) Applicant: QUALCOMM Incorporated, San Diego, CA (US)

(72) Inventors: Shay Landis, Hod Hasharon (IL); Assaf Touboul, Netanya (IL); Amit Bar-Or Tillinger, Tel-Aviv (IL); Gideon Shlomo Kutz, Ramat Hasharon (IL); Michael Levitsky, Rehovot (IL); Guy Wolf, Rosh Haayin (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/071,576

(22) Filed: Oct. 15, 2020

(65) Prior Publication Data

US 2021/0119846 A1    Apr. 22, 2021

Related U.S. Application Data

(60) Provisional application No. 62/916,000, filed on Oct. 16, 2019.

(51) Int. Cl.
*H04B 7/0456*    (2017.01)
*H04L 27/26*    (2006.01)
(Continued)

(52) U.S. Cl.
CPC ....... *H04L 27/2634* (2013.01); *H04B 7/0626* (2013.01); *H04L 1/0003* (2013.01);
(Continued)

(58) Field of Classification Search
CPC ... H04L 5/0007; H04L 5/0048; H04L 1/0003; H04L 1/0009; H04L 5/0044; H04L 5/006;
(Continued)

(56) References Cited

U.S. PATENT DOCUMENTS

| 6,292,760 B1 * | 9/2001 | Burns | G01R 23/16 324/76.19 |
| 7,915,935 B1 * | 3/2011 | Menon | H03L 7/18 455/75 |

(Continued)

FOREIGN PATENT DOCUMENTS

| EP | 3525376 A1 | 8/2019 |
| WO | WO-2019027360 A1 | 2/2019 |

OTHER PUBLICATIONS

International Search Report and Written Opinion—PCT/US2020/056061—ISA/EPO—dated Feb. 1, 2021.
(Continued)

*Primary Examiner* — Eva Y Puente
(74) *Attorney, Agent, or Firm* — Norton Rose Fulbright US LLP/Qualcomm Incorporated

(57) ABSTRACT

In one aspect, performing, by a wireless communication device, a non-coherent encoding operation on first data to generate a first transmission, wherein the non-coherent encoding operation encodes data independent of channel state information (CSI); and transmitting, by the wireless communication device, the first transmission, wherein the first transmission is non-coherently encoded. In another aspect, receiving, by a wireless communication device, a first transmission, wherein the first transmission is non-coherently encoded independent of channel state information (CSI); and performing, by the wireless communication device, a non-coherent decoding operation on the first trans-
(Continued)

mission to decode the first transmission. Other aspects and features are also claimed and described.

30 Claims, 11 Drawing Sheets

(51) Int. Cl.

| | | |
|---|---|---|
| H04L 27/20 | (2006.01) | |
| H04L 27/04 | (2006.01) | |
| H04L 5/00 | (2006.01) | |
| H04W 72/0446 | (2023.01) | |
| H04B 7/06 | (2006.01) | |
| H04L 1/00 | (2006.01) | |
| H04L 27/233 | (2006.01) | |
| H03M 7/30 | (2006.01) | |
| H04J 13/00 | (2011.01) | |

(52) U.S. Cl.
CPC .......... *H04L 5/0048* (2013.01); *H04L 5/0051* (2013.01); *H04L 27/04* (2013.01); *H04L 27/20* (2013.01); *H04L 27/233* (2013.01); *H04L 27/2605* (2013.01); *H04L 27/2607* (2013.01); *H04W 72/0446* (2013.01); *H03M 7/30* (2013.01); *H04B 7/0456* (2013.01); *H04J 13/00* (2013.01); *H04L 1/0042* (2013.01)

(58) Field of Classification Search
CPC ... H04L 1/0026; H04L 1/0068; H04L 1/0029; H04L 1/0073; H04L 27/2608; H04L 5/0046; H04L 5/0091; H04Q 2011/0086; H04Q 11/0005; H04Q 11/0062; H04Q 2011/0016; H04Q 2011/0041; H04Q 11/0003; H04Q 2011/0064; H04Q 2011/0081; H04Q 2011/0083; H04Q 2011/0084; H04Q 2011/0088; H04W 72/044; H04W 52/26; H04W 72/0406; H04W 72/0413; H04W 68/025; H04W 28/18; H04W 72/04; H04W 16/10; H04W 16/14; H04W 16/26; H04W 24/02; H04W 24/04; H04W 24/10

USPC .................................................. 375/260, 239
See application file for complete search history.

(56) References Cited

U.S. PATENT DOCUMENTS

| | | | |
|---|---|---|---|
| 2005/0111590 A1 | 5/2005 | Fang et al. | |
| 2006/0233233 A1* | 10/2006 | Welborn | H04L 25/4902 375/239 |
| 2010/0034165 A1 | 2/2010 | Han et al. | |
| 2011/0002463 A1* | 1/2011 | Michaels | H04L 9/0662 380/268 |
| 2015/0358116 A1* | 12/2015 | Khayrallah | H04L 25/03318 375/341 |
| 2017/0201347 A1* | 7/2017 | Borle | H04B 7/0885 |
| 2018/0227069 A1 | 8/2018 | Lee et al. | |
| 2020/0059342 A1 | 2/2020 | Sahin et al. | |
| 2021/0119840 A1* | 4/2021 | Landis | H04L 1/0042 |
| 2021/0135719 A1* | 5/2021 | Petersson | H04B 7/0639 |
| 2021/0226832 A1* | 7/2021 | Herceg | H04L 27/2607 |
| 2021/0345253 A1 | 11/2021 | Matsumura et al. | |

OTHER PUBLICATIONS

Toender N., et al., "Low-Complexity OFDM System with High Mobility Using DAPSK Schemes", Personal, Indoor and Mobile Radio Communications, 2006 IEEE 17th International Symposium on, IEEE, PI, Sep. 1, 2006 (Sep. 1, 2006), 5 Pages, XP031023759, ISBN: 978-1-4244-0329-5, Section I, Section II; Figure 1, Section III.B; Figures 4, 5.

Wang L., et al., "Low-Complexity Near-Optimum Multiple-Symbol Differential Detection of DAPSK Based on Iterative Amplitude/ Phase Processing", IEEE Transactions on Vehicular Technology, IEEE Service Center, Piscataway, NJ, US, vol. 61, No. 2, Feb. 1, 2012 (Feb. 1, 2012), pp. 894-900, XP011413077, ISSN: 0018-9545, DOI: 10.11 09/TVT.2011.2181192, Abstract, Section I, Section II.

\* cited by examiner

403B

| OFDM symbol n | OFDM symbol n+1 |
|---|---|
| $X_{n,0} = S_{n,0}$ | $X_{n+1,0} = X_{n,1}S_{n+1,0}$ |
| $X_{n,1} = S_{n,1}$ | $X_{n+1,1} = X_{n,1}S_{n+1,1}$ |
| $X_{n,2} = S_{n,2}$ | $X_{n+1,2} = X_{n,2}S_{n+1,2}$ |
| $X_{n,3} = S_{n,3}$ | $X_{n+1,3} = X_{n,3}S_{n+1,3}$ |
| $X_{n,4} = S_{n,4}$ | $X_{n+1,4} = X_{n,4}S_{n+1,4}$ |

Time Domain

| OFDM symbol n |
|---|
| $X_0 = S_0$ |
| $X_1 = X_0 S_1$ |
| $X_2 = X_1 S_2$ |
| $X_3 = X_2 S_3$ |
| $X_4 = X_3 S_4$ |

Frequency Domain

*FIG. 4D*

NON-COHERENT WAVEFORMS FOR WIRELESS COMMUNICATION

CROSS-REFERENCE TO RELATED APPLICATIONS

This application claims the benefit of U.S. Provisional Patent Application No. 62/916,000, entitled, "NON-COHERENT WAVEFORMS FOR WIRELESS COMMUNICATION," filed on Oct. 16, 2019, which is expressly incorporated by reference herein in its entirety. This application is also related to co-pending U.S. patent application Ser. No. 17/071,592, also entitled "NON-COHERENT WAVEFORMS FOR WIRELESS COMMUNICATION," filed on Oct. 15, 2020.

TECHNICAL FIELD

Aspects of the present disclosure relate generally to wireless communication systems, and more particularly, to non-coherent waveforms Certain embodiments of the technology discussed below can enable and provide reduced cost communications for advance wireless networks.

INTRODUCTION

Wireless communication networks are widely deployed to provide various communication services such as voice, video, packet data, messaging, broadcast, and the like. These wireless networks may be multiple-access networks capable of supporting multiple users by sharing the available network resources. Such networks, which are usually multiple access networks, support communications for multiple users by sharing the available network resources.

A wireless communication network may include a number of base stations or node Bs that can support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on the downlink to a UE and/or may receive data and control information on the uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

BRIEF SUMMARY OF SOME EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In one aspect of the disclosure, a method for wireless communication includes performing, by a wireless communication device, a non-coherent encoding operation on first data to generate a first transmission, wherein the non-coherent encoding operation encodes data independent of channel state information (CSI); and transmitting, by the wireless communication device, the first transmission, wherein the first transmission is non-coherently encoded.

In an additional aspect of the disclosure, an apparatus configured for wireless communication is disclosed. The apparatus includes means for performing, by a wireless communication device, a non-coherent encoding operation on first data to generate a first transmission, wherein the non-coherent encoding operation encodes data independent of channel state information (CSI); and means for transmitting, by the wireless communication device, the first transmission, wherein the first transmission is non-coherently encoded.

In an additional aspect of the disclosure, a non-transitory computer-readable medium having program code recorded thereon. The program code further includes code to perform, by a wireless communication device, a non-coherent encoding operation on first data to generate a first transmission, wherein the non-coherent encoding operation encodes data independent of channel state information (CSI); and transmit, by the wireless communication device, the first transmission, wherein the first transmission is non-coherently encoded.

In an additional aspect of the disclosure, an apparatus configured for wireless communication is disclosed. The apparatus includes at least one processor, and a memory coupled to the processor. The processor is configured to perform, by a wireless communication device, a non-coherent encoding operation on first data to generate a first transmission, wherein the non-coherent encoding operation encodes data independent of channel state information (CSI); and transmit, by the wireless communication device, the first transmission, wherein the first transmission is non-coherently encoded.

In another aspect of the disclosure, a method for wireless communication includes receiving, by a wireless communication device, a first transmission, wherein the first transmission is non-coherently encoded independent of channel state information (CSI); and performing, by the wireless communication device, a non-coherent decoding operation on the first transmission to decode the first transmission.

In an additional aspect of the disclosure, an apparatus configured for wireless communication is disclosed. The apparatus includes means for receiving, by a wireless communication device, a first transmission, wherein the first transmission is non-coherently encoded independent of channel state information (CSI); and means for performing, by the wireless communication device, a non-coherent decoding operation on the first transmission to decode the first transmission.

In an additional aspect of the disclosure, a non-transitory computer-readable medium having program code recorded thereon. The program code further includes code to receive, by a wireless communication device, a first transmission, wherein the first transmission is non-coherently encoded independent of channel state information (CSI); and perform, by the wireless communication device, a non-coherent decoding operation on the first transmission to decode the first transmission.

In an additional aspect of the disclosure, an apparatus configured for wireless communication is disclosed. The apparatus includes at least one processor, and a memory coupled to the processor. The processor is configured to receive, by a wireless communication device, a first transmission, wherein the first transmission is non-coherently encoded independent of channel state information (CSI); and perform, by the wireless communication device, a non-coherent decoding operation on the first transmission to decode the first transmission.

In another aspect of the disclosure, a method for wireless communication includes performing, by a wireless communication device, a non-coherent encoding operation on first data to generate a first transmission, wherein the non-coherent encoding operation encodes a first resource element based on a conjugate of a second resource element; and transmitting, by the wireless communication device, the first transmission, wherein the first transmission is non-coherently encoded.

In yet another aspect of the disclosure, a method for wireless communication includes, performing, by a wireless communication device, a non-coherent encoding operation on first data to generate a first transmission, wherein the non-coherent encoding operation encodes a first resource element based on a conjugate multiplication of two adjacent resource elements; and transmitting, by the wireless communication device, the first transmission, wherein the first transmission is non-coherently encoded.

In one aspect of the disclosure, a method for wireless communication includes performing, by a wireless communication device, a non-coherent encoding operation on first data to generate a first transmission, wherein the non-coherent encoding operation encodes data independent of channel state information (CSI) using a non-coherent differential modulation encoding scheme in a frequency domain for adjacent subcarriers in an orthogonal frequency-division multiplexing (OFDM) waveform; and transmitting, by the wireless communication device, the first transmission, wherein the first transmission is non-coherently encoded.

In an additional aspect of the disclosure, an apparatus configured for wireless communication is disclosed. The apparatus includes at least one processor, and a memory coupled to the processor. The processor is configured to perform, by a wireless communication device, a non-coherent encoding operation on first data to generate a first transmission, wherein the non-coherent encoding operation encodes data independent of channel state information (CSI) using a non-coherent differential modulation encoding scheme in a frequency domain for adjacent subcarriers in an orthogonal frequency-division multiplexing (OFDM) waveform; and transmit, by the wireless communication device, the first transmission, wherein the first transmission is non-coherently encoded.

In another aspect of the disclosure, a method for wireless communication includes receiving, by a wireless communication device, a first transmission, wherein the first transmission is non-coherently encoded independent of channel state information (CSI); and performing, by the wireless communication device, a non-coherent decoding operation on the first transmission to decode the first transmission using a non-coherent differential modulation decoding scheme in a frequency domain for adjacent subcarriers in an orthogonal frequency-division multiplexing (OFDM) waveform.

In an additional aspect of the disclosure, an apparatus configured for wireless communication is disclosed. The apparatus includes at least one processor, and a memory coupled to the processor. The processor is configured to receive, by a wireless communication device, a first transmission, wherein the first transmission is non-coherently encoded independent of channel state information (CSI); and perform, by the wireless communication device, a non-coherent decoding operation on the first transmission to decode the first transmission using a non-coherent differential modulation decoding scheme in a frequency domain for adjacent subcarriers in an orthogonal frequency-division multiplexing (OFDM) waveform.

In one aspect of the disclosure, a method for wireless communication includes performing, by a wireless communication device, a non-coherent encoding operation on first data to generate a first transmission, wherein the non-coherent encoding operation encodes data independent of channel state information (CSI) using a non-coherent differential modulation encoding scheme between orthogonal frequency-division multiplexing (OFDM) symbols; and transmitting, by the wireless communication device, the first transmission, wherein the first transmission is non-coherently encoded.

In an additional aspect of the disclosure, an apparatus configured for wireless communication is disclosed. The apparatus includes at least one processor, and a memory coupled to the processor. The processor is configured to perform, by a wireless communication device, a non-coherent encoding operation on first data to generate a first transmission, wherein the non-coherent encoding operation encodes data independent of channel state information (CSI) using a non-coherent differential modulation encoding scheme between orthogonal frequency-division multiplexing (OFDM) symbols; and transmit, by the wireless communication device, the first transmission, wherein the first transmission is non-coherently encoded.

In another aspect of the disclosure, a method for wireless communication includes receiving, by a wireless communication device, a first transmission, wherein the first transmission is non-coherently encoded independent of channel state information (CSI); and performing, by the wireless communication device, a non-coherent decoding operation on the first transmission to decode the first transmission using a non-coherent differential modulation decoding scheme between orthogonal frequency-division multiplexing (OFDM) symbols.

In an additional aspect of the disclosure, an apparatus configured for wireless communication is disclosed. The apparatus includes at least one processor, and a memory coupled to the processor. The processor is configured to receive, by a wireless communication device, a first transmission, wherein the first transmission is non-coherently encoded independent of channel state information (CSI); and perform, by the wireless communication device, a non-coherent decoding operation on the first transmission to decode the first transmission using a non-coherent differential modulation decoding scheme between orthogonal frequency-division multiplexing (OFDM) symbols.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments the exemplary embodiments can be implemented in various devices, systems, and methods.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

FIG. 4D is a block diagram illustrating an example of a non-coherent, frequency-domain encoding configured according to an aspect of the present disclosure.

FIG. 4E is a block diagram illustrating an example of a non-coherent, time-domain encoding configured according to an aspect of the present disclosure.

DETAILED DESCRIPTION

Figure 1:
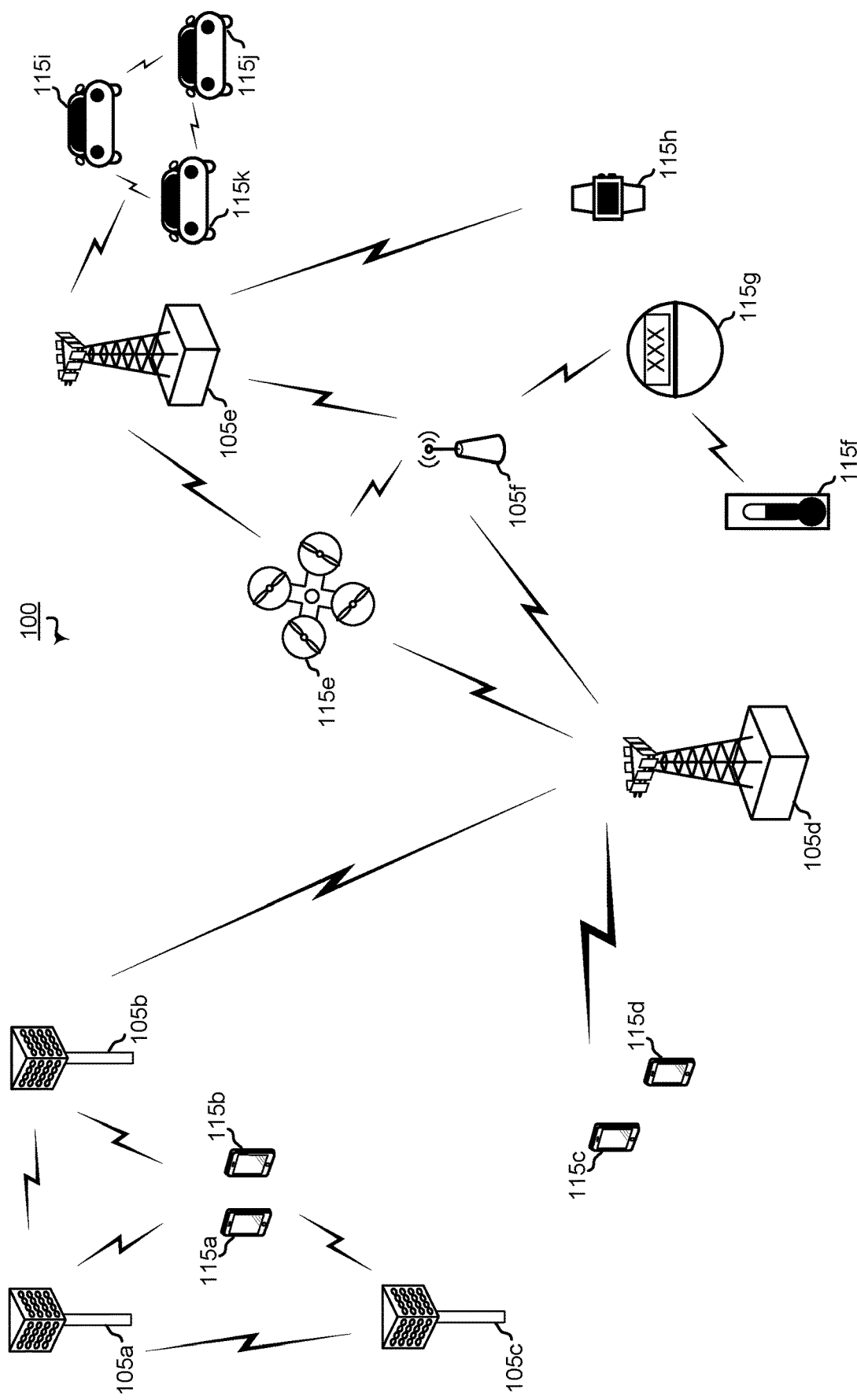
FIG. 1 is a block diagram illustrating details of a wireless communication system according to some embodiments of the present disclosure.

The detailed description is related to a new low cost mode and coding scheme for wireless communication, such as fifth generation wireless new radio (5G NR) systems. The low cost mode may be enabled for low power and low cost communications and uses non-coherent encoding and decoding to generate a new non-coherent waveform for wireless communication. Conventionally, wireless networks, such as 5G and 5G NR, utilize coherent encoding and decoding schemes (e.g., non-differential coding schemes) to provide robust protection against interference and errors. Additionally, reference signals are employed to further increase reliability. For example, channel state information (CSI), demodulation reference signals (DMRS), and tracking reference signal (TRS) pilot signals may be used during the encoding and/or decoding process. As an illustrative, non-limiting illustration, a CSI reference signal (CSI-RS) may be used by a network entity (e.g., base station) to generate a coherent transmission, and the network entity transmits the CSI-RS to a user equipment (UE). The UE may estimate channel characteristics based on the CSI-RS and report the channel characteristics to the network entity. However, such coherent encoding and decoding schemes utilize significant power and processing resources, as compared to the disclosed non-coherent coding schemes. Additionally, such coherent encoding and decoding schemes are susceptible to the Doppler effect. Thus, conventional signals may degrade and/or not adapt well to mobile devices, as the movement of the mobile device will cause Doppler spread which may impact decoding.

The described techniques relate to improved methods, systems, devices, and apparatuses that support non-coherent encoding and decoding for network devices. For example, non-coherent encoding and decoding may be used as an alternative mode and waveform for reduced power operation and/or reduced processing operation. As an example, in 5G NR, a non-coherent operating mode or modes may enable reduced power operation, concurrent operations (e.g., wireless communication and other processing), and/or high mobility operations. Non-coherent encoding and decoding may include or correspond to differential encoding and decoding. In some implementations, non-coherent encoding and decoding is performed independent of CSI. Additionally, or alternatively, non-coherent encoding and decoding includes encoding data for a particular symbol based one or more adjacent symbols. To illustrate, a symbol may be multiplied by a conjugate of an adjacent symbol to encode data in a particular implementation. Such non-coherent encoding and decoding may enable enhanced operation and flexibility in wireless communication, such as 5G NR. Accordingly, such techniques may increase device performance, reduce device cost, and increase reliability of data sessions and voice calls.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

This disclosure relates generally to providing or participating in communication as between two or more wireless devices in one or more wireless communications systems, also referred to as wireless communications networks. In various embodiments, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, $5^{th}$ Generation (5G) or new radio (NR) networks (sometimes referred to as "5G NR" networks/systems/devices), as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as GSM. 3GPP defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with Universal Terrestrial Radio Access Networks (UTRANs) in the case of a UMTS/GSM network. An operator network may also include one or more LTE networks, and/or one or more other networks. The various different network types may use different radio access technologies (RATs) and radio access networks (RANs).

An OFDMA network may implement a radio technology such as evolved UTRA (E-UTRA), Institute of Electrical and Electronic Engineers (IEEE) 802.11, IEEE 802.16, IEEE 802.20, flash-OFDM and the like. UTRA, E-UTRA, and Global System for Mobile Communications (GSM) are part of universal mobile telecommunication system (UMTS). In particular, long term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3rd Generation Partnership Project (3GPP) is a collaboration between groups of telecommunications associations that aims to define a globally applicable third generation (3G) mobile phone specification. 3GPP long term evolution (LTE) is a 3GPP project which was aimed at improving the universal mobile telecommunications system (UMTS) mobile phone standard. The 3GPP may define specifications for the next generation of mobile networks, mobile systems, and mobile devices. The present disclosure is concerned with the evolution of wireless technologies from LTE, 4G, 5G, NR, and beyond with shared access to wireless spectrum between networks using a collection of new and different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1M nodes/km$^2$), ultra-low complexity (e.g., ~10 s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 ms), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD)/frequency division duplex (FDD) design; and advanced wireless technologies, such as massive multiple input, multiple output (MIMO), robust millimeter wave (mmWave) transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHz FDD/TDD implementations, subcarrier spacing may occur with 15 kHz, for example over 1, 5, 10, 20 MHz, and the like bandwidth. For other various outdoor and small cell coverage deployments of TDD greater than 3 GHz, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHz, subcarrier spacing may occur with 120 kHz over a 500 MHz bandwidth.

The scalable numerology of 5G NR facilitates scalable transmission time interval (TTI) for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink/downlink scheduling information, data, and acknowledgment in the same subframe. The self-contained integrated subframe supports communications in unlicensed or contention-based shared spectrum, adaptive uplink/downlink that may be flexibly configured on a per-cell basis to dynamically switch between uplink and downlink to meet the current traffic needs.

For clarity, certain aspects of the apparatus and techniques may be described below with reference to exemplary LTE implementations or in an LTE-centric way, and LTE terminology may be used as illustrative examples in portions of the description below; however, the description is not intended to be limited to LTE applications. Indeed, the present disclosure is concerned with shared access to wireless spectrum between networks using different radio access technologies or radio air interfaces, such as those of 5G NR.

Moreover, it should be understood that, in operation, wireless communication networks adapted according to the concepts herein may operate with any combination of licensed or unlicensed spectrum depending on loading and availability. Accordingly, it will be apparent to one of skill in the art that the systems, apparatus and methods described herein may be applied to other communications systems and applications than the particular examples provided.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and/or other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also include additional components and features for implementation and practice of claimed and described embodiments. It is intended that innovations described herein may be practiced in a wide variety of implementations, including both large/small devices, chip-level components, multi-component systems (e.g. RF-chain, communication interface, processor), distributed arrangements, end-user devices, etc. of varying sizes, shapes, and constitution.

FIG. 1 shows wireless network 100 for communication according to some embodiments. Wireless network 100 may, for example, comprise a 5G wireless network. As appreciated by those skilled in the art, components appearing in FIG. 1 are likely to have related counterparts in other network arrangements including, for example, cellular-style network arrangements and non-cellular-style-network arrangements (e.g., device to device or peer to peer or ad hoc network arrangements, etc.).

Wireless network 100 illustrated in FIG. 1 includes a number of base stations 105 and other network entities. A base station may be a station that communicates with the UEs and may also be referred to as an evolved node B (eNB), a next generation eNB (gNB), an access point, and the like. Each base station 105 may provide communication coverage for a particular geographic area. In 3GPP, the term "cell" can refer to this particular geographic coverage area of a base station and/or a base station subsystem serving the coverage area, depending on the context in which the term is used. In implementations of wireless network 100 herein, base stations 105 may be associated with a same operator or different operators (e.g., wireless network 100 may comprise a plurality of operator wireless networks), and may provide wireless communications using one or more of the same frequencies (e.g., one or more frequency bands in licensed spectrum, unlicensed spectrum, or a combination thereof) as a neighboring cell. In some examples, an individual base station 105 or UE 115 may be operated by more than one network operating entity. In other examples, each base station 105 and UE 115 may be operated by a single network operating entity.

A base station may provide communication coverage for a macro cell or a small cell, such as a pico cell or a femto cell, and/or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 1, base stations 105d and 105e are regular macro base stations, while base stations 105a-105c are macro base stations enabled with one of 3 dimension (3D), full dimension (FD), or massive MIMO. Base stations 105a-105c take advantage of their higher dimension MIMO capabilities to exploit 3D beamforming in both elevation and azimuth beamforming to increase coverage and capacity. Base station 105f is a small cell base station which may be a home node or portable access point. A base station may support one or multiple (e.g., two, three, four, and the like) cells.

Wireless network 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 115 are dispersed throughout the wireless network 100, and each UE may be stationary or mobile. It should be appreciated that, although a mobile apparatus is commonly referred to as user equipment (UE) in standards and specifications promulgated by the 3rd Generation Partnership Project (3GPP), such apparatus may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. Within the present document, a "mobile" apparatus or UE need not necessarily have a capability to move, and may be stationary. Some non-limiting examples of a mobile apparatus, such as may comprise embodiments of one or more of UEs 115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an "Internet of things" (IoT) or "Internet of everything" (IoE) device such as an automotive or other transportation vehicle, a satellite radio, a global positioning system (GPS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 115a-115d of the embodiment illustrated in FIG. 1 are examples of mobile smart phone-type devices accessing wireless network 100 A UE may also be a machine specifically configured for connected communication, including machine type communication (MTC), enhanced MTC (eMTC), narrowband IoT (NB-IoT) and the like. UEs 115e-115k illustrated in FIG. 1 are examples of various machines configured for communication that access wireless network 100.

A mobile apparatus, such as UEs 115, may be able to communicate with any type of the base stations, whether macro base stations, pico base stations, femto base stations, relays, and the like. In FIG. 1, a lightning bolt (e.g., communication link) indicates wireless transmissions between a UE and a serving base station, which is a base station designated to serve the UE on the downlink and/or uplink, or desired transmission between base stations, and backhaul transmissions between base stations. Backhaul communication between base stations of wireless network 100 may occur using wired and/or wireless communication links.

In operation at wireless network 100, base stations 105a-105c serve UEs 115a and 115b using 3D beamforming and coordinated spatial techniques, such as coordinated multi-point (CoMP) or multi-connectivity. Macro base station 105d performs backhaul communications with base stations 105a-105c, as well as small cell, base station 105f. Macro base station 105d also transmits multicast services which are subscribed to and received by UEs 115c and 115d. Such multicast services may include mobile television or stream video, or may include other services for providing community information, such as weather emergencies or alerts, such as Amber alerts or gray alerts.

Wireless network 100 of embodiments supports mission critical communications with ultra-reliable and redundant links for mission critical devices, such UE 115e, which is a drone. Redundant communication links with UE 115e include from macro base stations 105d and 105e, as well as small cell base station 105f. Other machine type devices, such as UE 115f (thermometer), UE 115g (smart meter), and UE 115h (wearable device) may communicate through wireless network 100 either directly with base stations, such as small cell base station 105f, and macro base station 105e, or in multi-hop configurations by communicating with another user device which relays its information to the network, such as UE 115f communicating temperature measurement information to the smart meter, UE 115g, which is then reported to the network through small cell base station 105f. Wireless network 100 may also provide additional network efficiency through dynamic, low-latency TDD/FDD communications, such as in a vehicle-to-vehicle (V2V) mesh network between UEs 115i-115k communicating with macro base station 105e.

Figure 2:
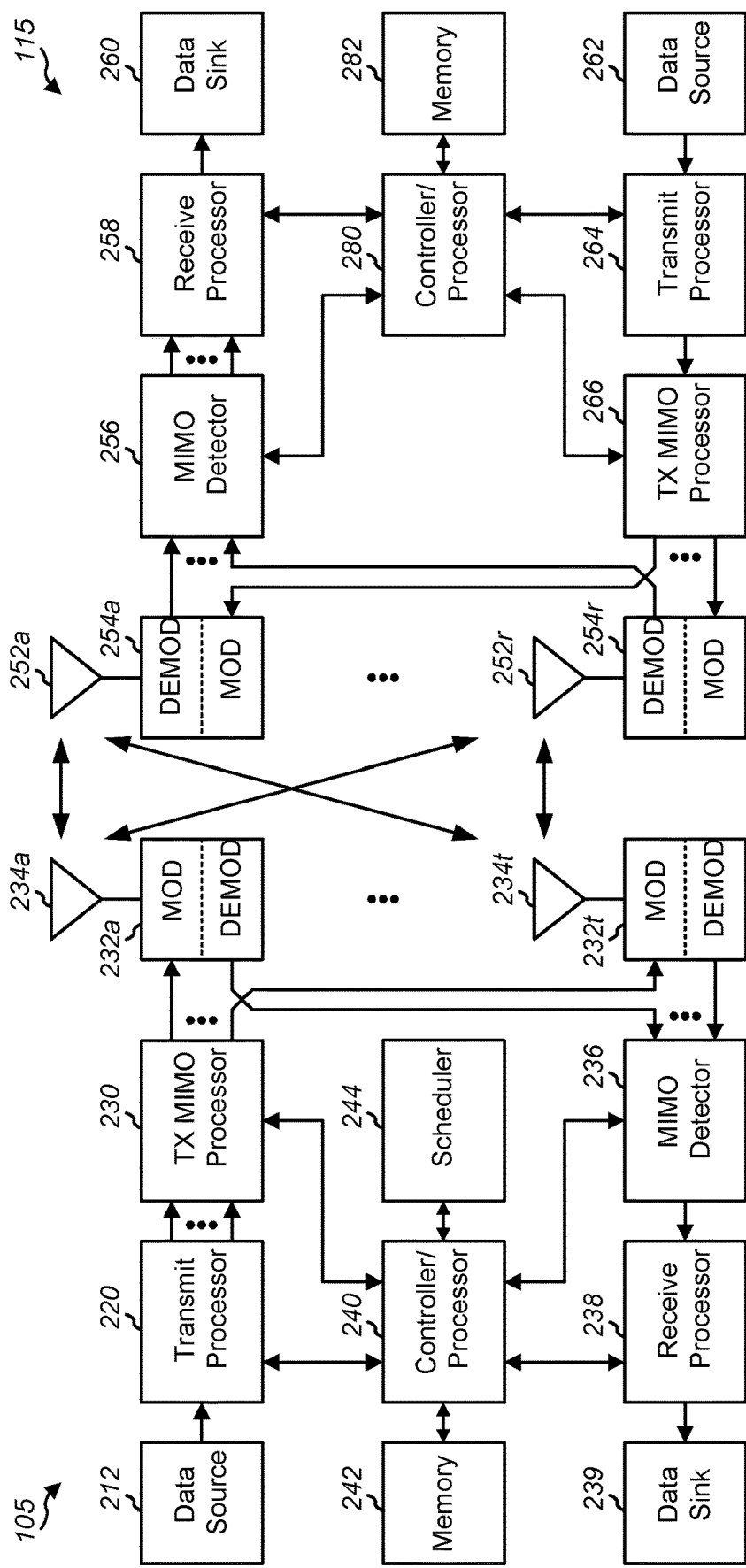
FIG. 2 is a block diagram conceptually illustrating a design of a base station and a UE configured according to some embodiments of the present disclosure.

FIG. 2 shows a block diagram of a design of a base station 105 and a UE 115, which may be any of the base stations and one of the UEs in FIG. 1. For a restricted association scenario (as mentioned above), base station 105 may be small cell base station 105f in FIG. 1, and UE 115 may be UE 115c or 115D operating in a service area of base station 105f, which in order to access small cell base station 105f, would be included in a list of accessible UEs for small cell base station 105f Base station 105 may also be a base station of some other type. As shown in FIG. 2, base station 105 may be equipped with antennas 234a through 234t, and UE 115 may be equipped with antennas 252a through 252r for facilitating wireless communications.

At the base station 105, a transmit processor 220 may receive data from a data source 212 and control information from a controller/processor 240. The control information may be for the physical broadcast channel (PBCH), physical control format indicator channel (PCFICH), physical hybrid-ARQ (automatic repeat request) indicator channel (PHICH), physical downlink control channel (PDCCH), enhanced physical downlink control channel (EPDCCH), MTC physical downlink control channel (MPDCCH), etc. The data may be for the PDSCH, etc. The transmit processor 220 may process (e.g., encode and symbol map) the data and control information to obtain data symbols and control symbols, respectively. The transmit processor 220 may also generate reference symbols, e.g., for the primary synchronization signal (PSS) and secondary synchronization signal (SSS), and cell-specific reference signal. Transmit (TX) multiple-input multiple-output (MIMO) processor 230 may perform spatial processing (e.g., precoding) on the data symbols, the control symbols, and/or the reference symbols, if applicable, and may provide output symbol streams to modulators (MODs) 232a through 232t. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232a through 232t may be transmitted via the antennas 234a through 234t, respectively.

At the UE 115, the antennas 252a through 252r may receive the downlink signals from the base station 105 and may provide received signals to the demodulators (DE-MODs) 254a through 254r, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from demodulators 254a through 254r, perform MIMO detection on the received symbols if applicable, and provide detected symbols. Receive processor 258 may process (e.g., demodulate, deinterleave, and decode) the detected symbols, provide decoded data for the UE 115 to a data sink 260, and provide decoded control information to a controller/processor 280.

On the uplink, at the UE 115, a transmit processor 264 may receive and process data (e.g., for the physical uplink shared channel (PUSCH)) from a data source 262 and control information (e.g., for the physical uplink control channel (PUCCH)) from the controller/processor 280. Transmit processor 264 may also generate reference symbols for a reference signal. The symbols from the transmit processor 264 may be precoded by TX MIMO processor 266 if applicable, further processed by the modulators 254a through 254r (e.g., for SC-FDM, etc.), and transmitted to the base station 105. At base station 105, the uplink signals from UE 115 may be received by antennas 234, processed by demodulators 232, detected by MIMO detector 236 if applicable, and further processed by receive processor 238 to obtain decoded data and control information sent by UE 115. Processor 238 may provide the decoded data to data sink 239 and the decoded control information to controller/processor 240.

Controllers/processors 240 and 280 may direct the operation at base station 105 and UE 115, respectively. Controller/processor 240 and/or other processors and modules at base station 105 and/or controller/processor 280 and/or other processors and modules at UE 115 may perform or direct the execution of various processes for the techniques described herein, such as to perform or direct the execution illustrated in FIGS. 6A-6C and 7A-7C, and/or other processes for the techniques described herein. Memories 242 and 282 may store data and program codes for base station 105 and UE 115, respectively. Scheduler 244 may schedule UEs for data transmission on the downlink and/or uplink.

Wireless communications systems operated by different network operating entities (e.g., network operators) may share spectrum. In some instances, a network operating entity may be configured to use an entirety of a designated shared spectrum for at least a period of time before another network operating entity uses the entirety of the designated shared spectrum for a different period of time. Thus, in order to allow network operating entities use of the full designated shared spectrum, and in order to mitigate interfering communications between the different network operating entities, certain resources (e.g., time) may be partitioned and allocated to the different network operating entities for certain types of communication.

For example, a network operating entity may be allocated certain time resources reserved for exclusive communication by the network operating entity using the entirety of the shared spectrum. The network operating entity may also be allocated other time resources where the entity is given priority over other network operating entities to communicate using the shared spectrum. These time resources, prioritized for use by the network operating entity, may be utilized by other network operating entities on an opportunistic basis if the prioritized network operating entity does not utilize the resources. Additional time resources may be allocated for any network operator to use on an opportunistic basis.

Access to the shared spectrum and the arbitration of time resources among different network operating entities may be centrally controlled by a separate entity, autonomously determined by a predefined arbitration scheme, or dynamically determined based on interactions between wireless nodes of the network operators.

In some cases, UE 115 and base station 105 may operate in a shared radio frequency spectrum band, which may include licensed or unlicensed (e.g., contention-based) frequency spectrum. In an unlicensed frequency portion of the shared radio frequency spectrum band, UEs 115 or base stations 105 may traditionally perform a medium-sensing procedure to contend for access to the frequency spectrum. For example, UE 115 or base station 105 may perform a listen before talk (LBT) procedure such as a clear channel assessment (CCA) prior to communicating in order to determine whether the shared channel is available. A CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own backoff window based on the amount of energy detected on a channel and/or the acknowledge/negative-acknowledge (ACK/NACK) feedback for its own transmitted packets as a proxy for collisions.

Conventional encoding and decoding for 5G, including NR, utilizes coherent decoding. Conventional coherent encoding and decoding, such as coherent phase shift keying (CPSK), requires a complicated demodulator, because the demodulator extracts a reference wave from a received signal and keeps track of it, i.e., compares each sample to it.

Phase-shift keying (PSK) is a digital modulation process which conveys data by changing (modulating) the phase of a constant frequency reference signal (the carrier wave). The modulation is accomplished by varying the sine and cosine inputs at a precise time. It is widely used for wireless LANs, radio-frequency identification (RFID) and Bluetooth communication. Any digital modulation scheme uses a finite number of distinct signals to represent digital data. PSK uses a finite number of phases, each assigned a unique pattern of binary digits. Usually, each phase encodes an equal number of bits. Each pattern of bits forms the symbol that is represented by the particular phase. The demodulator, which is designed specifically for the symbol-set used by the modulator, determines the phase of the received signal and maps it back to the symbol it represents, thus recovering the original data. This requires the receiver to be able to compare the phase of the received signal to a reference signal—such a system is termed coherent (and specifically to as CPSK).

Alternatively, in non-coherent encoding and decoding a difference between two successive symbols may be used. For example, in differential phase-shift keying (DPSK), a phase shift of each symbol sent can be measured with respect to a phase of a previous symbol sent. The symbols are encoded in a difference in phase between successive samples. DPSK can be significantly simpler to implement than ordinary coherent PSK, as it is a 'non-coherent' scheme, i.e. there is no need for the demodulator to keep track of a reference wave.

Conventionally, the trade-off for reduced power and processing between coherent and non-coherent coding was increased demodulation errors for coherent. However, it has been found that demodulation errors in non-coherent encoding decrease as the signal speed increases, from the increase in frequency of the signal. Thus, for 5G NR where the signal speed is higher, non-coherent encoding produces better performance and its congenitally known drawback begins to drop off or alleviate. To illustrate, non-coherent encoding and decoding produces less demodulation errors for high-speed waves. For example, a block error rate (BLER) for non-coherent coding is less than a BLER for coherent coding at signal speeds of 120 kilometers an hour (kmh).

Systems and methods described herein are directed to non-coherent encoding and decoding for network devices. For example, non-coherent encoding and decoding may be used as an alternative mode for reduced power operation and/or reduced processing operation. As an example, in 5G NR, non-coherent operating modes may enable reduced power operation, concurrent operations (e.g., wireless communication and other processing), and/or high mobility operations. Non-coherent encoding and decoding may include or correspond to differential encoding and decoding. In some implementations, non-coherent encoding and decoding is performed independent of CSI. Additionally, or alternatively, non-coherent encoding and decoding includes encoding data for a particular symbol based one or more adjacent symbols. To illustrate, a symbol may be multiplied by a conjugate of an adjacent symbol to encode data in a particular implementation. Non-coherent encoding and decoding can be performed on a waveform, e.g., an orthogonal frequency-division multiplexing (OFDM) waveform. Such non-coherent encoding and decoding may enable enhanced operation and flexibility in wireless communication, such as 5G NR. Accordingly, such systems and methods may increase device performance, reduce device cost, and increase reliability of data sessions and voice calls.

Figure 3:
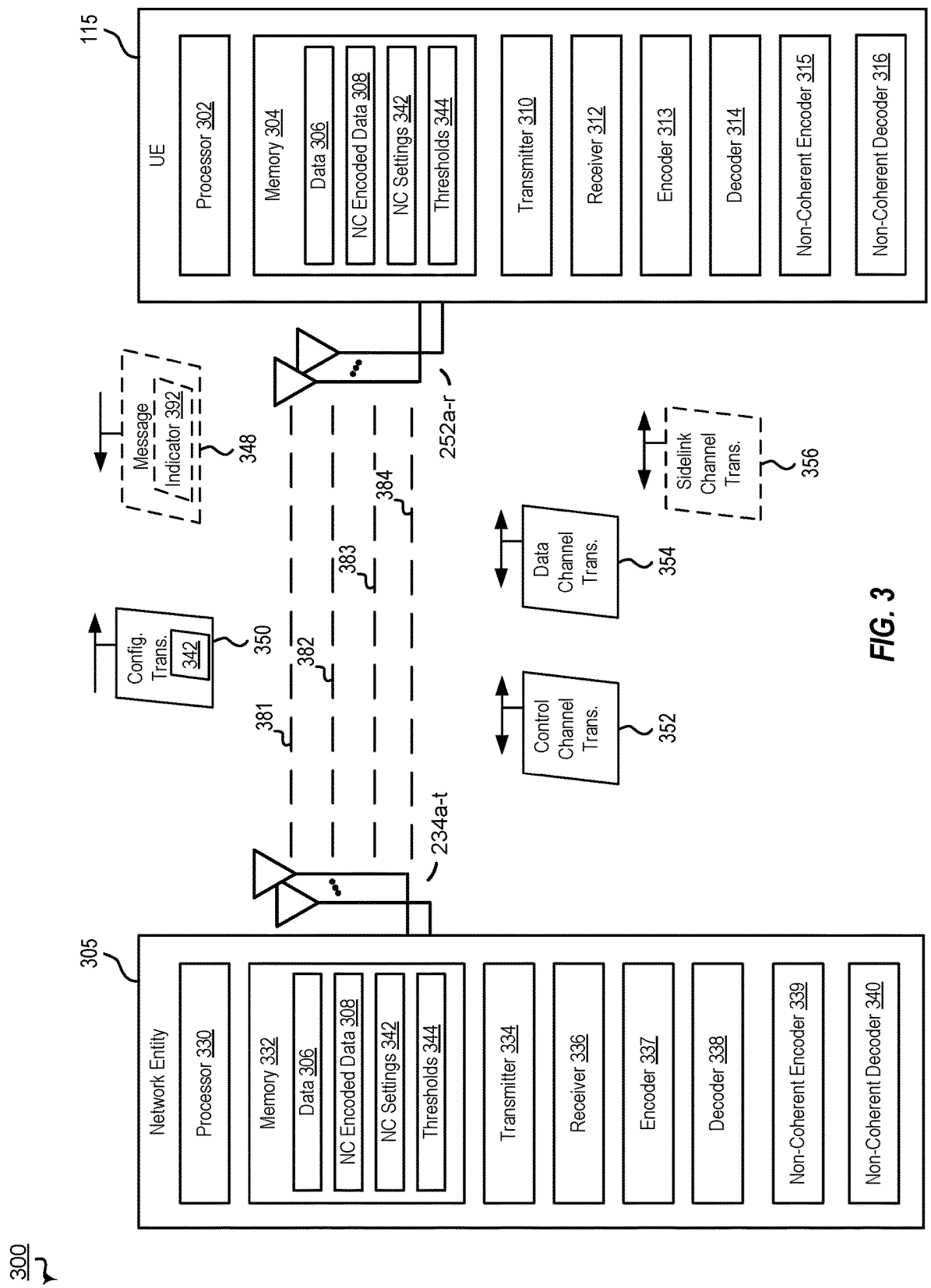
FIG. 3 is a block diagram illustrating an example of a wireless communications system that enables enhanced radio link monitoring in accordance with aspects of the present disclosure.

FIG. 3 illustrates an example of a wireless communications system 300 that supports non-coherent transmissions, non-coherent encoding and decoding, in accordance with aspects of the present disclosure. In some examples, wireless communications system 300 may implement aspects of wireless communication system 100. For example, wireless communications system 300 may include UE 115 and network entity 305. Non-coherent transmissions may enable improved network performance and non-coherent encoding and decoding may enable improved device performance. For example, non-coherent transmissions may enable fewer dropped calls and increased reliability, and non-coherent encoding may enable power savings and reduced costs.

Network entity 305 and UE 115 may be configured to communicate via frequency bands, such as FR1 having a frequency of 410 to 7125 MHz or FR2 having a frequency of 24250 to 52600 MHz for mm-Wave. It is noted that sub-carrier spacing (SCS) may be equal to 15, 30, 60, or 120 kHz for some data channels. Network entity 305 and UE 115 may be configured to communicate via one or more component carriers (CCs), such as representative first CC 381, second CC 382, third CC 383, and fourth CC 384. Although four CCs are shown, this is for illustration only, more or fewer than four CCs may be used. One or more CCs may be used to communicate control channel transmissions, data channel transmissions, and/or sidelink channel transmissions.

For example, control channel transmissions 352 and data channel transmissions 354 may be transmitted between UE 115 and network entity 305. Such transmissions may include a Physical Downlink Control Channel (PDCCH), a Physical Downlink Shared Channel (PDSCH), a Physical Uplink Control Channel (PUCCH), or a Physical Uplink Shared Channel (PUSCH). Optionally, sidelink channel transmissions 356 may be transmitted between UE 115 and network entity 305 or between UE 115 and another network device (e.g., another UE). Such sidelink channel transmissions may include a Physical Sidelink Control Channel (PSCCH), a Physical Sidelink Shared Channel (PSSCH), or a Physical Sidelink Feedback Channel (PSFCH). The above transmissions may be scheduled by aperiodic grants and/or periodic grants.

Each periodic grant may have a corresponding configuration, such as configuration parameters/settings. The periodic grant configuration may include configured grant (CG) configurations and settings. Additionally, or alternatively, one or more periodic grants (e.g., CGs thereof) may have or be assigned to a CC ID, such as intended CC ID.

Each CC may have a corresponding configuration, such as configuration parameters/settings. The configuration may include bandwidth, bandwidth part, hybrid automatic repeat request (HARQ) process, transmission configuration indicator (TCI) state, reference signal (RS), control channel resources, data channel resources, or a combination thereof. Additionally, or alternatively, one or more CCs may have or be assigned to a Cell ID, a Bandwidth Part (BWP) ID, or both. The Cell ID may include a unique cell ID for the CC, a virtual Cell ID, or a particular Cell ID of a particular CC of the plurality of CCs. Additionally, or alternatively, one or more CCs may have or be assigned to a HARQ ID. Each CC may also have corresponding management functionalities, such as, beam management, BWP switching functionality, or both. In some implementations, two or more CCs are quasi co-located, such that the CCs have the same beam and/or same symbol.

In some implementations, control information may be communicated via network entity 305 and UE 115. For example, the control information may be communicated suing MAC-CE transmissions, radio resource control (RRC) transmissions, DCI, transmissions, another transmission, or a combination thereof.

UE 115 includes processor 302, memory 304, transmitter 310, receiver 312, encoder, 313, decoder 314, non-coherent encoder 315, non-coherent decoder 316, and antennas 252a-r. Processor 302 may be configured to execute instructions stored at memory 304 to perform the operations described herein. In some implementations, processor 302 includes or corresponds to controller/processor 280, and memory 304 includes or corresponds to memory 282. Memory 304 may also be configured to store data 306, non-coherently encoded data 308, non-coherent coding settings data 342, thresholds 344, or a combination thereof, as further described herein.

The data 306 includes or corresponds to data unencoded data or decoded data. The non-coherently encoded data 308 includes or corresponds to data that has been non-coherently encoded, such as differentially encoded and/or encoded independent of CSI. The non-coherent coding settings data 342 may include or correspond to data associated with encoding and/or decoding data. For example, non-coherent coding settings data 342 may include or indicate a non-coherent coding mode, a non-coherent coding parameter, a non-coherent coding algorithm, etc. To illustrate, the non-coherent coding mode may indicate a single layer mode, multiple layer mode, M-ary phase shift-keying (MPSK), amplitude and phase shift-keying (APSK), transmission only, reception only, both transmission and reception, etc. The non-coherent coding parameter may indicate a number of layers or a level of MPSK/APSK, such as 8 or 16. As another illustration, the non-coherent coding algorithm may specify which algorithm to use. Such settings may be pre-set and/or RRC configurable. The thresholds 344 may include or correspond to thresholds for determining when to perform non-coherent coding, which non-coherent coding mode to select, what non-coherent coding parameter to use, etc.

Transmitter 310 is configured to transmit data to one or more other devices, and receiver 312 is configured to receive data from one or more other devices. For example, transmitter 310 may transmit data, and receiver 312 may receive data, via a network, such as a wired network, a wireless network, or a combination thereof. For example, UE 115 may be configured to transmit and/or receive data via a direct device-to-device connection, a local area network (LAN), a wide area network (WAN), a modem-to-modem connection, the Internet, intranet, extranet, cable transmission system, cellular communication network, any combination of the above, or any other communications network now known or later developed within which permits two or more electronic devices to communicate. In some implementations, transmitter 310 and receiver 312 may be replaced with a transceiver. Additionally, or alternatively, transmitter 310, receiver, 312, or both may include or correspond to one or more components of UE 115 described with reference to FIG. 2.

Encoder 313 and decoder 314 may be configured to encode and decode data for transmissions, such as coherently encode and decode data. Non-coherent encoder 315 may be configured to non-coherently encode data for transmissions. For example, the non-coherent encoder 315 is configured to differentially encode data independent of CSI to generate encoded data for a transmission. The non-coherent encoder 315 may perform one or more operations described with reference to FIG. 4A. Non-coherent decoder 316 may be configured to non-coherently decode data from transmissions. For example, non-coherent decoder 316 is configured to non-coherently decode data from transmissions.

Network entity 305 includes processor 330, memory 332, transmitter 334, receiver 336, encoder 335, decoder 338, non-coherent encoder 339, non-coherent decoder 340, and antennas 234a-t. Processor 330 may be configured to execute instructions stores at memory 332 to perform the operations described herein. In some implementations, processor 330 includes or corresponds to controller/processor 240, and memory 332 includes or corresponds to memory 242. Memory 332 may be configured to store data 306, non-coherent encoded data 308, non-coherent coding settings data 342, thresholds 344, or a combination thereof, similar to the UE 115 and as further described herein.

Transmitter 334 is configured to transmit data to one or more other devices, and receiver 336 is configured to receive data from one or more other devices. For example, transmitter 334 may transmit data, and receiver 336 may receive data, via a network, such as a wired network, a wireless network, or a combination thereof. For example, network entity 305 may be configured to transmit and/or receive data via a direct device-to-device connection, a local area network (LAN), a wide area network (WAN), a modem-to-modem connection, the Internet, intranet, extranet, cable transmission system, cellular communication network, any combination of the above, or any other communications network now known or later developed within which permits two or more electronic devices to communicate. In some implementations, transmitter 334 and receiver 336 may be replaced with a transceiver. Additionally, or alternatively, transmitter 334, receiver, 336, or both may include or correspond to one or more components of network entity 305 described with reference to FIG. 2. Encoder 335, decoder 338, non-coherent encoder 315, and non-coherent decoder 316 may include the same functionality as described with reference to encoder 313, decoder 314, non-coherent encoder 315, and non-coherent decoder 316, respectively.

During operation of wireless communications system 300, network entity 305 may determine that UE 115 has non-coherent coding capability. For example, UE 115 may transmit a message 348 that includes a non-coherent coding indicator 392. Indicator 392 may indicate non-coherent coding capability or a particular type of non-coherent coding, such as 8-MPSK. In some implementations, network entity 305 sends control information to indicate to UE 115 that non-coherent coding is to be used. For example, in some implementations, message 348 (or another message, such as configuration transmission 350) is transmitted by the network entity 305. The configuration transmission 350 may include or indicate to use non-coherent coding or to adjust or implement a setting of non-coherent coding, such as a particular mode of non-coherent coding.

During operation, devices of wireless communications system 300, transmit control, data, and/or sidelink channel transmissions to other devices of wireless communications system 300. For example, UE 115 and a base station (e.g., 305) may transmit control and data information on control and data channels. One or more of the transmissions may include quality indicators, such as control channel quality indicators and/or data channel quality indicators. The quality indicators may be monitored by UE 115 and/or stored.

In some implementations, UE 115 and network entity 305 initiate a data session, such as a voice call. The data session may be setup using control and/or data channel transmissions. During setup of the data session or upon joining the network, non-coherent coding information may be transmitted or determined. For example, the network entity 305 may transmit information indicating a particular non-coherent coding mode, and/or may transmit information indicating a particular non-coherent coding setting or parameter used by the network entity 305. As another example, the non-coherent coding may be determined based on channel quality data, device mobility, transmission frequency, battery level, etc., or a combination thereof.

After the UE 115 or network entity 305 determine to use non-coherent coding, one or more devices may begin to perform non-coherent coding operations to encode and/or decode data. For example, the UE 115 may map a first resource element to a stored value. Additionally, or alternatively, the UE 115 may multiply two adjacent symbols for a particular resource element to generate a product, and may map the particular resource element to the product of the multiplication of the two adjacent symbols. In one implementation, a particular symbol is multiplied by a conjugate of an adjacent symbol. Additional coding details are described with reference to FIGS. 4A and 5.

UE 115 and network entity 305 may continue to perform non-coherent coding operations until the end of the data session, a particular condition is satisfied, or until a change in a channel parameter or a UE parameter is determined, such as a change in channel quality data, device mobility, transmission frequency, device mobility, device battery level, etc., or a combination thereof.

Thus, FIG. 3 describes non-coherent encoding and decoding operations. When non-coherent encoding is performed on a waveform, e.g., an OFDM waveform, the non-coherently encoded waveform may be referred to as a non-coherent waveform. Using non-coherent waveforms to transmit data may enable improved device and network performance. Using non-coherent waveforms to transmit data enables a network to reduce overhead and latency and improve reliability.

Figure 4A:
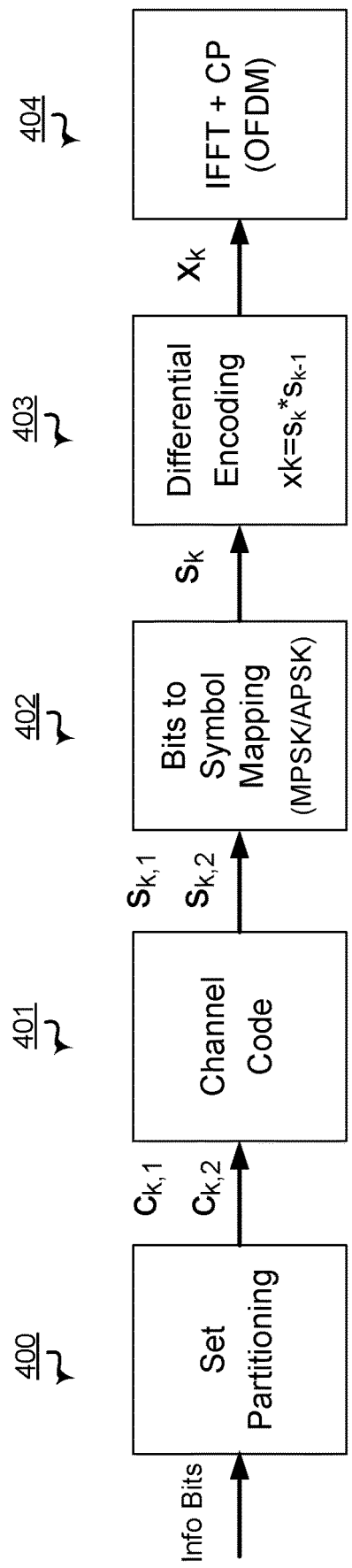
FIG. 4A is a block diagram illustrating example blocks executed by a non-coherent encoder configured according to an aspect of the present disclosure.

FIG. 4A illustrates an example of a non-coherent encoder that supports non-coherent encoding in accordance with aspects of the present disclosure. In some examples, non-coherent encoder may implement aspects of wireless communication system 100 or 300. For example, non-coherent encoder (e.g., Non-Coherent Encoder 315, 339) may be included in UE 115 and/or network entity 305. Non-coherent encoding and using non-coherent waveforms to transmit data may enable fewer dropped calls and increased reliability.

FIG. 4A illustrates a particular encoding flow for multi-level coding (MLC) or multi-layer coding. In single level coding, set partitioning may not be utilized. Additionally, a channel coder (encoder) may not be used and/or may not code multiple bits streams into multiple separate channels Bits of data may be directly mapped to a symbol. Additionally, FIG. 4A illustrates an encoding flow for M-PSK (e.g., M-PSK mapping). In other implementations, other type of differential on or non-differential coding schemes may be used for bit to symbol mapping. For example, other phase shift keying coding may be used, such as A-PSK, to map bits to a symbol.

Performing the non-coherent encoding operation may include multiplying two adjacent symbols (e.g., adjacent in time, frequency, or both) for a particular resource element to generate a product, and mapping the particular resource element to the product of the multiplication of the two adjacent symbols. Additionally, or alternatively, performing the non-coherent encoding operation may include mapping a first resource element to a stored value. For example, first bits (e.g., top center bits, 000) may be mapped to a set or configurable value (e.g., 0 or 000).

The non-coherent encoding operation includes performing, at 400, set partitioning of information bits of the first data to generate multiple bit streams (e.g., $C_{k,1}$ and $C_{k,2}$). For example, a plurality of bits corresponding to data and/or a transmission may be divided or split into segment of N number of bits based on encoding parameters (e.g., settings). The segments may correspond to separate bits streams (e.g., $C_{k,1}$ and $C_{k,2}$) that are to be non-coherently encoded.

The non-coherent encoding operation also includes performing, at 401, channel coding on each bit stream of the multiple bit streams (e.g., separately) to generate channel coded bits (e.g., $S_{k,1}$ and $S_{k,2}$). For example, channel encoding is performed on each bit stream (e.g., $C_{k,1}$ and $C_{k,2}$) to generate corresponding channel coded bits (e.g., $S_{k,1}$ and $S_{k,2}$).

The non-coherent encoding operation includes performing, at 402, bits to symbol mapping on the channel coded bits to generate symbols (e.g., $S_k$). For example, phase shift keying symbol mapping is performed on the sets of channel coded bits (e.g., $S_{k,1}$ and $S_{k,2}$) to generate a corresponding symbol (e.g., $S_k$). To illustrate, multiple sets of channel coded bits (e.g., $S_{k,1}$ and $S_{k,2}$) may be mapped to one symbol (e.g., $S_k$).

The non-coherent encoding operation also includes performing, at 403, differential encoding on the symbols to generate differentially encoded symbols (e.g., $X_k$). For example, a symbol may be differentially encoded to generate a corresponding differentially encoded symbol. Differential encoding may include multiplying two adjacent symbols to generate a differentially encoded symbol ($X_k=S_k*X_{k-1}$), as illustrated in FIG. 4A. As an illustrative, non-limiting example, channel bits of a resource element (RE) are (0,0,0). Then the symbol 000 (e.g., Sk) will be selected for the channel bits and the resource element. The symbol 000 (which is represented by the particular phase, frequency and/or amplitude of a point on a constellation map, such as in FIGS. 4B and 4C) is then multiplied by a conjugate (e.g., symbol/signal conjugate) of an adjacent symbol (e.g., a symbol for an adjacent or next RE/set of bits) to generate a corresponding differentially encoded symbol (e.g., $X_k$). To illustrate, the symbol 000 and a conjugate of an adjacent symbol (e.g., symbol 001) are multiplied to produce an encoded symbol. The conjugate of an adjacent symbol may be determined by an exponential of a conjugate of phase difference or shift (delta phase or phase 1–phase 2) between adjacent symbols, exp(i*(phase1–phase2)). To illustrate, $s1*conj(s2)=e^{(i*(phase1-phase2))}$. The differential encoding operation may be performed in the frequency domain, the time domain, or both. A detailed example of differential encoding in the frequency domain is illustrated in FIG. 4D, and a detailed example of differential encoding in the time domain is illustrated in FIG. 4E.

The non-coherent encoding operation further includes performing, at 404, inverse fast Fourier transform (inverse FFT or IFFT) and cyclic prefix (CP) operations (e.g., orthogonal frequency-division multiplexing (OFDM)) on the differentially encoded symbols to generate OFDM symbols. For example, inverse FFT operations calculations may be applied to each encoded symbol to generate a corresponding OFDM symbol. After the inverse FFT operations have been performed, cyclic prefixes may be inserted between OFDM symbols (e.g., before a corresponding OFDM symbol) to generate a transmission.

In some implementations, performing the non-coherent encoding operation includes utilizing resource elements (REs) allocated for demodulation reference signal (DMRS) as data conveying REs to increase a coding gain. Additionally or alternatively, performing the non-coherent encoding operation includes performing the non-coherent encoding operation independent of a demodulation reference signal (DMRS). In addition, performing the non-coherent encoding operation may further include repurposing unused REs for data.

In some implementations, performing the non-coherent encoding operation includes performing the non-coherent encoding operation independent of channel estimation, channel equalization, or both. For example, with respect to channel estimation, encoding may be performed without the aid of reference signals, such as DMRS, TRS, etc. As another example, with respect to channel equalization, distortion caused by or from signal transmission through a channel may not be accounted for during encoding.

Figure 4C:
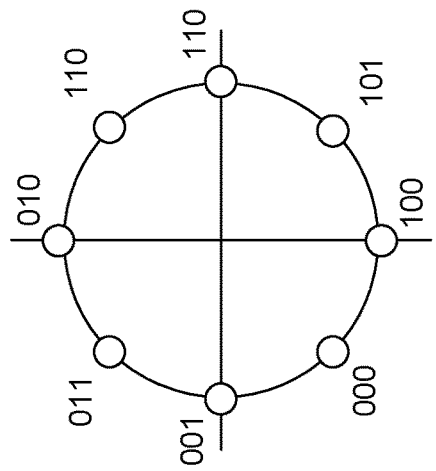
FIGS. 4B and 4C illustrate examples of 8-PSK signal constellations.
Figure 4B:
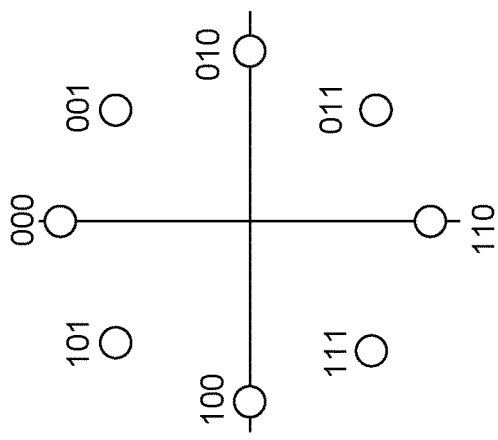

FIGS. 4B and 4C illustrate examples of 8-PSK signal constellations. In FIG. 4B, a first example of a signal constellation is illustrated. In FIG. 4C a second example of a signal constellation is illustrated. FIGS. 4B and 4C illustrate examples of bit mapping to 8-PSK modulation. Each signal constellation maps a series of bits (e.g., 000) to a particular amplitude and phase of a symbol (e.g., tone). Although constant amplitude constellation are illustrated in FIGS. 4B and 4C, in other implementations non-constant amplitude constellations may be used, such as A-PSK constellations.

FIG. 4D illustrates an example of non-coherent, frequency domain encoding in accordance with aspects of the present disclosure. The non-coherent, frequency domain encoding of FIG. 4D illustrates a particular example, 403A, of the non-coherent encoding 403 illustrated in FIG. 4A.

In FIG. 4D, a single set of REs are shown for a single OFDM symbol, OFDM symbol n. As an illustrative example, five REs (aka symbols) are shown. Greater than five or fewer than five REs may be used in other implementations. For a first RE ($X_0$), the differential encoding equation of $X_k=S_k*X_{k-1}$ from 403 of FIG. 4A produces $S_0$ as the differently encoded first symbol. For the second through fifth REs ($X_1$-$X_4$), differential encoding in the frequency domain produces $X_0S_1$, $X_1S_2$, $X_2S_3$, and $X_3S_4$, respectively.

FIG. 4E illustrates an example of non-coherent, time domain encoding in accordance with aspects of the present disclosure. The non-coherent, time domain encoding of FIG. 4E illustrates a particular example, 403B, of the non-coherent encoding 403 illustrated in FIG. 4A.

In FIG. 4E, two adjacent sets of REs are shown for adjacent OFDM symbols, first REs for a first OFDM symbol (symbol n) and second REs for a second OFDM symbol (symbol n+1). As an illustrative example, five REs (aka symbols) are shown for each OFDM symbol. Greater than five or fewer than five REs may be used in other implementations. For a first RE ($X_{n,0}$) of the first OFDM symbol, the differential encoding equation of $X_k=S_k*X_{k-1}$ from 403 of FIG. 4A produces $S_{n,0}$ as the differently encoded first symbol. For the second through fifth REs ($X_1$-$X_4$), differential encoding in the time domain produces $S_{n,1}$, $S_{n,2}$, $S_{n,3}$, and $S_{n,4}$, respectively.

For a first RE ($X_{n+1,0}$) of the second set of REs and for the second OFDM symbol, the differential encoding equation of $X_k=S_k*X_{k-1}$ from FIG. 4A produces $X_{n,0}S_{n+1,0}$ as the differently encoded first symbol. For the second through fifth REs ($X_{n+1,1}$-$X_{n+1,4}$), differential encoding in the time domain produces $X_{n,1}S_{n+1,1}$, $X_{n,2}S_{n+1,2}$, $X_{n,3}S_{n+1,3}$, and $X_{n,4}S_{n+1,4}$, respectively. Accordingly, the frequency domain encoding of FIG. 4D encodes data in phase difference between two consecutive resource elements (REs) of a same OFDM symbol, while the time domain encoding of FIG. 4E encodes data in phase difference between two consecutive resource elements (REs) belonging to two adjacent OFDM symbols.

Figure 5:
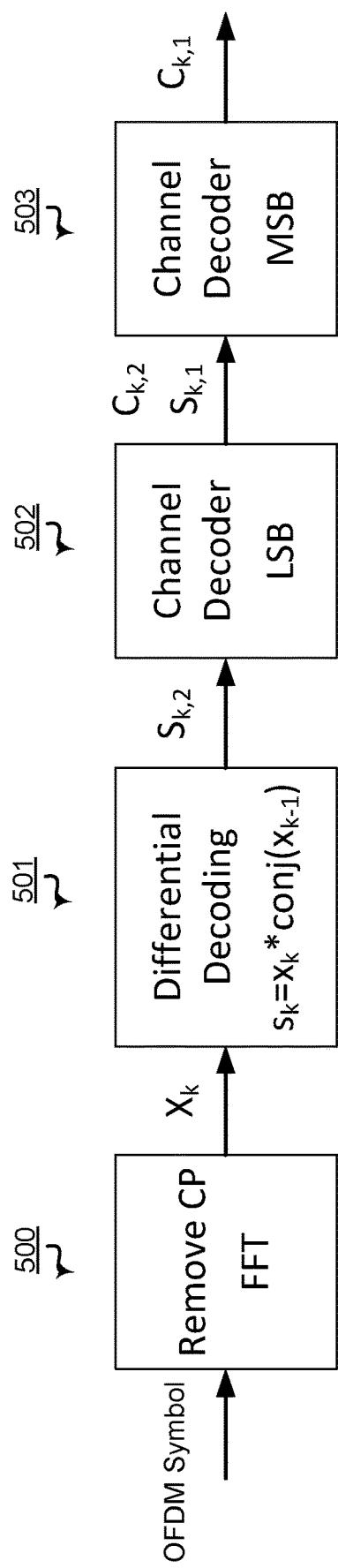
FIG. 5 is a block diagram illustrating example blocks executed by a non-coherent decoder configured according to an aspect of the present disclosure.

FIG. 5 illustrates an example of a non-coherent decoder that supports non-coherent decoding in accordance with aspects of the present disclosure. In some examples, non-coherent decoder may implement aspects of wireless communication system 100 or 300. For example, the non-coherent decoder (e.g., Non-Coherent Decoder 316, 340) may be included in UE 115 and/or network entity 305. Non-coherent decoding and transmissions using non-coherent waveforms may enable fewer dropped calls and increased reliability.

FIG. 5 illustrates a particular decoding flow for multi-level coding (MLC) or multi-layer coding. In single level coding, a single channel decoder may be used. Additional channel decoders may be used in other implementations, such as 3 channel decoders for 3 level coding. Additionally, FIG. 5 illustrates a decoding flow for M-PSK. In other implementations, other type of differential on or non-differential coding schemes may be used. For example, other phase shift keying coding may be used, such as A-PSK.

The non-coherent decoding operation includes removing, at 500, a cyclic prefix from OFDM symbols and performing FFT operations to generate differentially encoded symbols. For example, each encoded OFDM symbol of a plurality of encoded OFDM symbols are processed by a FFT algorithm to generate differentially encoded symbols ($X_k$) after corresponding cyclic prefixes are removed. Each OFDM symbol ($X_k$) may be processed to generate a corresponding differentially encoded symbol of the differentially encoded symbols.

The non-coherent decoding operation also includes performing, at 501, differential decoding on the differentially encoded symbols to generate channel encoded bits. For example, each differentially encoded symbol is differentially decoded to generate a corresponding set of encoded bits for a particular channel, that is to generate a corresponding set of channel encoded bits ($S_{k,2}$). To illustrate, the differential decoding may include multiplying a particular differentially encoded symbol ($X_k$) by a conjugate of a neighbor (adjacent symbol) of the particular differentially encoded symbol, such as conj($X_{k-1}$) or conj($X_{k+1}$), to generate a corresponding set of channel encoded bits ($S_{k,2}$). The non-coherent decoding operation may be performed in or for the frequency domain, the time domain, or both, and analogous to the frequency domain and the time domain encoding illustrated in FIGS. 4D and 4E.

An OFDM symbol may include, indicate, or correspond to a plurality of resource elements (REs). A resource element may be one subcarrier by one symbol period (e.g., symbol). As an illustrative, non-limiting example, an OFDM symbol may have or represent 1000 REs. Each RE may be mapped to one or more OFDM symbols. In a 1 symbol mapping mode, a particular RE is mapped to a corresponding OFDM symbol A RE may be indicated by a RE number (i) and may be denoted by $x_i$. A constellation s for mapping REs to symbols includes elements $S_j$ where j=1 to M. So, each RE can transmit any of the possible M symbols. The symbols $s_j$ may be described as $s_j=a_j+i*b$. In some implementations, the conjugate multiplication of two adjacent REs is mapped to a symbol. To illustrate, $x_1=s_2*conj(s_1)$, $x_j=s_j*conj(s_{j-1})$. Prior to performing conjugate multiplication based mapping, a particular or first RE may be mapped or set to a reference value. For example, the reference value may have a value from −1 and 1, e.g. −1≥x0≤1.

The non-coherent decoding operation includes performing, at 502, least significant bit (LSB) channel decoding on the channel encoded bits to generate partially decoded bits. To illustrate, a portion (e.g., one or more bits) of a particular set of channel encoded bits ($S_{k,2}$) may be decoded or mapped to generate corresponding partially decoded bits (e.g., $C_{k,2}$ and $S_{k,1}$). For example, if the channel encoded bits have two bits, a last or right most bit may be decoded. As another example, if the channel encoded bits have four bits, a last or right most two bits may be decoded.

The non-coherent decoding operation further includes performing, at 503, most significant bit (MSB) channel decoding on the partially decoded bits to generate decoded bits (e.g., $C_{k,1}$). To illustrate, a portion (e.g., one or more bits) of the partially decoded bits (e.g., $C_{k,2}$ and $S_{k,1}$) may be decoded or mapped to generate decoded bits (e.g., $C_{k,1}$). For example, if the partially decoded bits have two bits, a first or left most bit may be decoded. As another example, if the partially decoded bits have four bits, a first or left most two bits may be decoded.

In some implementations, such as MPSK decoding operations, performing the non-coherent decoding operation includes multiplying a resource element with a conjugate of an adjacent (e.g., next or consecutive) resource element to decode the RE. In other implementations, such as A-PSK decoding operations, performing the non-coherent decoding operation includes dividing a resource element by a conjugate of an adjacent resource element to decode the RE. Although multiple layer encoding and decoding are illustrated in FIGS. 4A and 5, in other implementations, the encoding and/or decoding may include a single layer, i.e., single layer encoding/decoding.

Figures 6A, 7A:
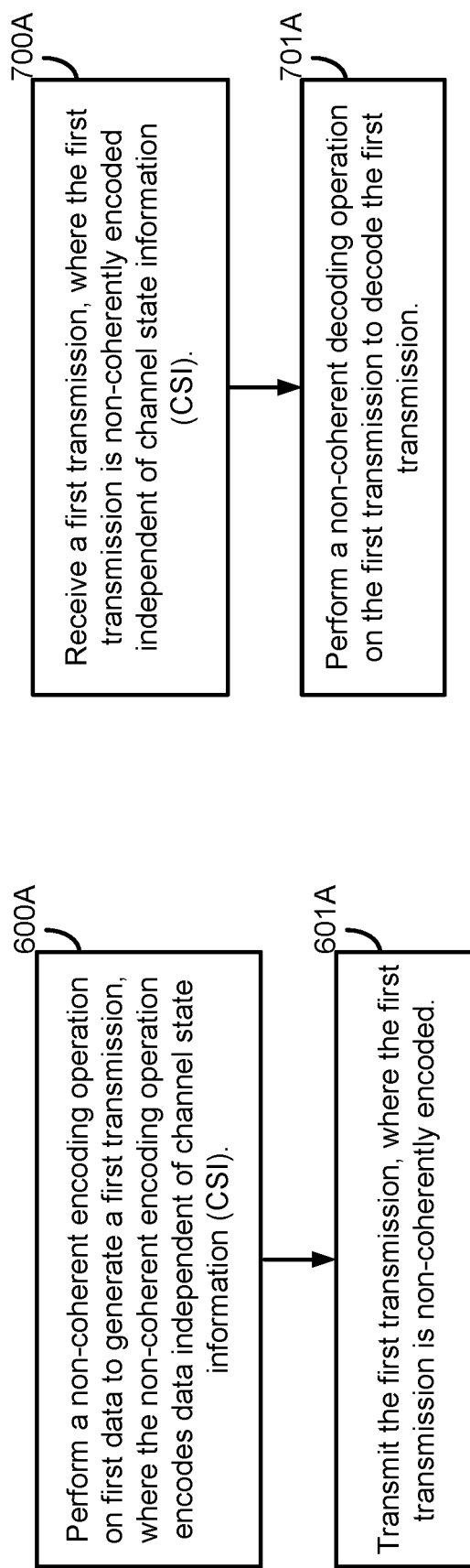
FIG. 6A is a block diagram illustrating example blocks executed by a wireless communication device configured according to an aspect of the present disclosure.
FIG. 7A is a block diagram illustrating example blocks executed by a wireless communication device configured according to an aspect of the present disclosure.
Figure 8:
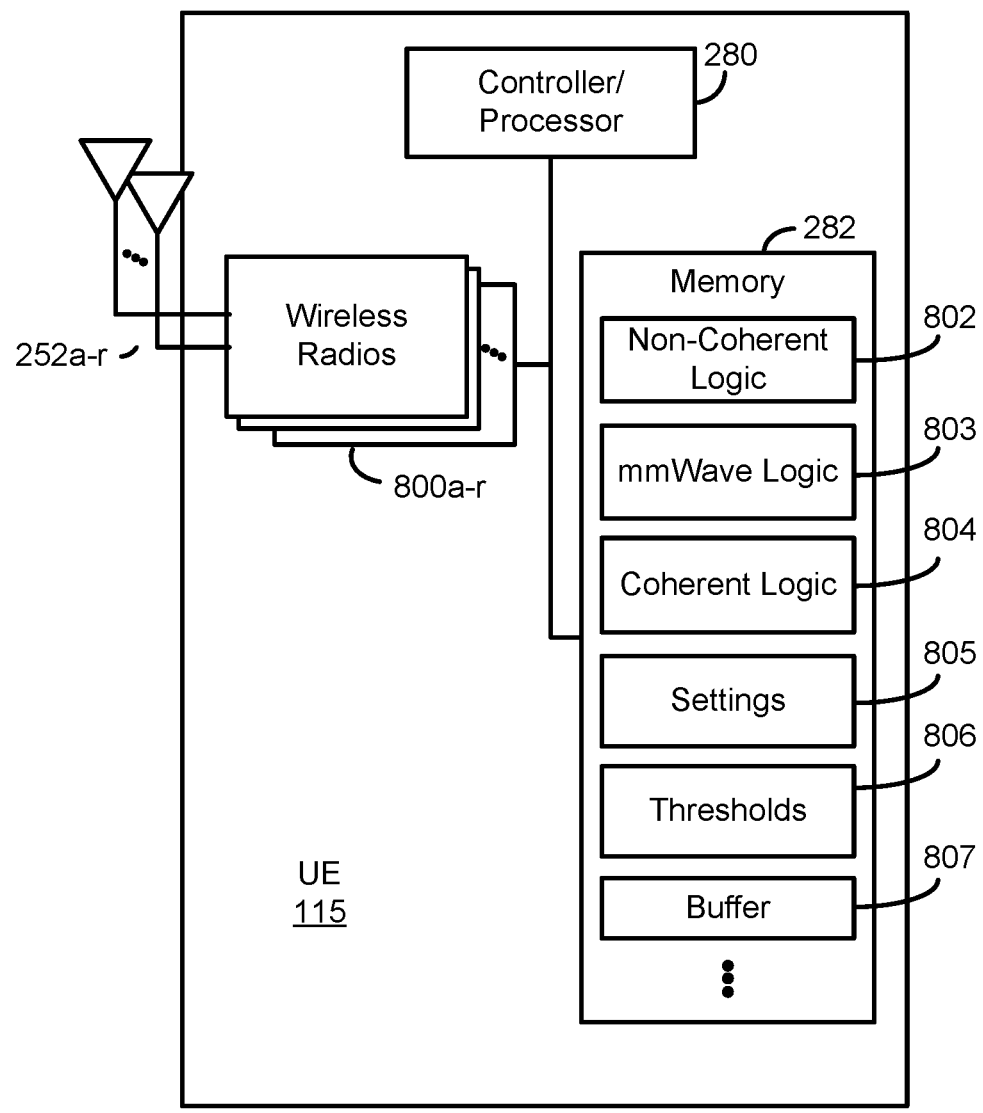
FIG. 8 is a block diagram conceptually illustrating a design of a UE according to some embodiments of the present disclosure.

FIG. 6A is a block diagram illustrating example blocks executed by a wireless communication device configured according to an aspect of the present disclosure. The example blocks will also be described with respect to UE 115 as illustrated in FIG. 8. However, another wireless communication device, such as network entity (e.g., base station 105), may execute such blocks in other implementations. Referring to FIG. 8, FIG. 8 is a block diagram illustrating UE 115 configured according to one aspect of the present disclosure. UE 115 includes the structure, hardware, and components as illustrated for UE 115 of FIG. 2. For example, UE 115 includes controller/processor 280, which operates to execute logic or computer instructions stored in memory 282, as well as controlling the components of UE 115 that provide the features and functionality of UE 115. UE 115, under control of controller/processor 280, transmits and receives signals via wireless radios 800*a-r* and antennas 252*a-r*. Wireless radios 800*a-r* includes various components and hardware, as illustrated in FIG. 2 for UE 115, including modulator/demodulators 254*a-r*, MIMO detector 256, receive processor 258, transmit processor 264, and TX MIMO processor 266. As illustrated in the example of FIG. 8, memory 282 stores Non-Coherent logic 802, mmWave logic 803, Coherent logic 804, Settings 805, Thresholds 806, and Buffer 807.

At block 600A, a mobile communication device, such as a UE, performs a non-coherent encoding operation on first data to generate a first transmission. For example, the UE 115 performs a non-coherent encoding operation as described in FIG. 3 or 4A. The non-coherent encoding operation may be performed independent of channel state information (CSI). In some implementations, the first data is encoded in phase difference between two consecutive resource elements (REs) in a frequency domain. For example, a first RE and a second RE, a second RE and a third RE, etc., of a single OFDM symbol are encoded, as described with reference to FIGS. 4D and 6B. In other implementations, the first data is encoded in phase difference between two consecutive resource elements (REs) in a time domain belonging to two adjacent OFDM symbols. For example, first REs (e.g., consecutive or adjacent in time) from two different OFDM symbol are encoded, as described with reference to FIGS. 4E and 6C. Additionally, the first transmission may correspond to a millimeter wave transmission in some implementations.

The UE 115 may execute, under control of controller/processor 280, Non-Coherent logic 802, stored in memory 282. The execution environment of Non-Coherent logic 802 provides the functionality for UE 115 to define and perform the non-coherent encoding and decoding procedures. Additionally, the UE 115 may execute one or more of mmWave logic 803 and or coherent logic 804. The execution environment of Non-Coherent logic 802 (and optionally mmWave logic 803) defines the different non-coherent encoding and decoding processes, such as determining to perform non-coherent encoding/decoding, performing the non-coherent encoding/decoding, adjusting non-coherent encoding/decoding settings, or a combination thereof. To illustrate, UE 115 may determine to operate in a particular non-coherent encoding/decoding mode based on a configuration message.

At block 601A, the UE 115 transmits the first transmission that is non-coherently encoded. For example, the UE 115 sends a transmission, such as 352-356, via wireless radios 800*a-r* and antennas 252*a-r*, and the transmission was non-coherently encoded, such as generated independent of channel state information. The transmission, such as a waveform thereof, may be referred to as a non-coherent transmissions or non-coherent waveform. Additionally, such non-coherent transmissions and waveforms are often referred to as differential transmissions or waveforms. The transmission may include multiple slots or may be one of multiple transmissions for a set of contiguous slots of a window or frame. In some implementations, each slot is allocated to or for downlink transmissions. In other implementations, the slots include uplink and downlink slots. Additionally, or alternatively, every N number of slots includes a downlink centric slot. A downlink centric slot may include control information, data information (e.g., user data information), acknowledgment information, or a combination thereof.

In some implementations, performing the non-coherent encoding operation includes performing the non-coherent encoding operation independent of a DMRS hardware buffer, a symbol hardware buffer, or both. To illustrate, as the symbols are differentially encoded and the data is encoded in phase difference between adjacent or consecutive symbols, a reference signal buffer may not be utilized during encoding (or decoding). Performing the non-coherent encoding operation enables phase noise reduction for low to mid-rate modulation and coding scheme (MCS), such a single layer mode modulation modes.

The wireless communication device (e.g., UE 115 or gNB 105) may execute additional blocks (or the wireless communication device may be configured further perform additional operations) in other implementations. For example, the wireless communication device may perform one or more operations described above. As another example, the wireless communication device may perform one or more aspects as described below.

In a first aspect, the first data is encoded in phase difference between two consecutive resource elements (REs) in a frequency domain.

In a second aspect, alone or in combination with the first aspect, the first data is encoded in phase difference between two consecutive resource elements (REs) in a time domain belonging to two adjacent OFDM symbols.

In a third aspect, alone or in combination with one or more of the above aspects, the performing the non-coherent encoding operation comprises encoding based on a phase shift keying based modulation scheme or an amplitude and phase shift keying based modulation scheme.

In a fourth aspect, alone or in combination with one or more of the above aspects, the performing the non-coherent encoding operation comprises encoding based on an amplitude difference modulation scheme.

In a fifth aspect, alone or in combination with one or more of the above aspects, the wireless communication device operates according to a slot format, and wherein each slot is allocated to downlink transmissions.

In a sixth aspect, alone or in combination with one or more of the above aspects, the wireless communication device operates according to a slot format, and wherein every N number of slots includes a downlink centric slot.

In a seventh aspect, alone or in combination with one or more of the above aspects, performing the non-coherent encoding operation comprises performing the non-coherent encoding operation independent of tracking reference signal (TRS) pilots.

In an eighth aspect, alone or in combination with one or more of the above aspects, performing the non-coherent encoding operation comprises utilizing resource elements (REs) allocated for demodulation reference signal (DMRS) as data conveying REs for higher coding gain.

In a ninth aspect, alone or in combination with one or more of the above aspects, performing the non-coherent encoding operation includes: multiplying two adjacent symbols for a particular resource element to generate a product; and mapping the particular resource element to the product of the multiplication of the two adjacent symbols.

In a tenth aspect, alone or in combination with one or more of the above aspects, performing the non-coherent encoding operation includes: mapping a first resource element to a stored value.

In an eleventh aspect, alone or in combination with one or more of the above aspects, performing the non-coherent encoding operation includes: performing set partitioning of information bits of the first data to generate multiple bit streams; performing channel coding on each bits stream of the multiple bit streams to generate corresponding channel coded bits; performing bits to symbol mapping on each channel coded bits to generate corresponding symbols; performing differential encoding on each symbol to generate differentially encoded symbols; and performing inverse fast Fourier transform (IFFT) and cyclic prefix (CP) operations on the differentially encoded symbols to generate OFDM symbols.

In a twelfth aspect, alone or in combination with one or more of the above aspects, each fast Fourier transform (FFT) symbol is encoded independent of other FFT symbols.

In a thirteenth aspect, alone or in combination with one or more of the above aspects, each fast Fourier transform (FFT) symbol is encoded based on an adjacent FFT symbol.

In a fourteenth aspect, alone or in combination with one or more of the above aspects, performing the non-coherent encoding operation comprises repurposing unused resource elements for data.

In a fifteenth aspect, alone or in combination with one or more of the above aspects, performing the non-coherent encoding operation comprises performing the non-coherent encoding operation independent of channel estimation.

In a sixteenth aspect, alone or in combination with one or more of the above aspects, performing the non-coherent encoding operation comprises performing the non-coherent encoding operation independent of channel equalization.

In a seventeenth aspect, alone or in combination with one or more of the above aspects, performing the non-coherent encoding operation comprises performing the non-coherent encoding operation independent of a demodulation reference signal (DMRS).

In an eighteenth aspect, alone or in combination with one or more of the above aspects, performing the non-coherent encoding operation comprises performing the non-coherent encoding operation independent of a DMRS hardware buffer, a symbol hardware buffer, or both.

In a nineteenth aspect, alone or in combination with one or more of the above aspects, performing the non-coherent encoding operation enables phase noise reduction for low to mid-rate modulation and coding scheme (MCS).

In a twentieth aspect, alone or in combination with one or more of the above aspects, the wireless communication device is a user equipment or a network entity.

In a twenty-first aspect, alone or in combination with one or more of the above aspects, the user equipment is a reduced capability user equipment with a single receive antenna.

In a twenty-second aspect, alone or in combination with one or more of the above aspects, performing the non-coherent encoding operation comprises performing the non-coherent encoding operation independent of spatial multiplexing.

Figures 6B, 7B:
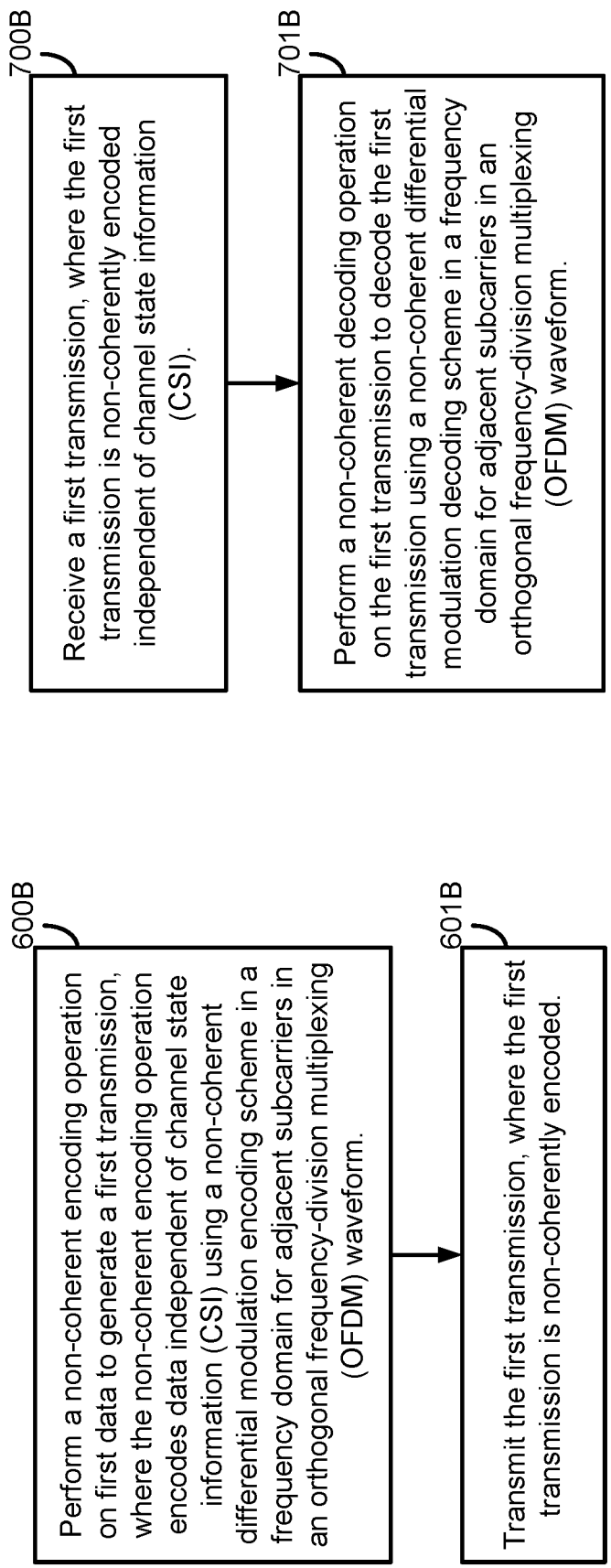
FIG. 6B is a block diagram illustrating example blocks executed by a wireless communication device configured according to an aspect of the present disclosure.
FIG. 7B is a block diagram illustrating example blocks executed by a wireless communication device configured according to an aspect of the present disclosure.

FIG. 6B is a block diagram illustrating example blocks executed by a UE configured according to an aspect of the present disclosure. The example blocks will also be described with respect to UE 115 as illustrated in FIG. 8. However, another wireless communication device, such as network entity (e.g., base station 105), may execute such blocks in other implementations.

At block 600B, a mobile communication device, such as a UE, performs a non-coherent encoding operation on first data to generate a first transmission using a non-coherent differential modulation encoding scheme in a frequency domain for adjacent subcarriers in an orthogonal frequency-division multiplexing (OFDM) waveform. For example, the UE 115 performs a non-coherent encoding operation as described in FIG. 3 or 4A. The non-coherent encoding operation may be performed independent of channel state information (CSI) using a non-coherent differential modulation encoding scheme in the frequency domain for adjacent subcarriers in an orthogonal frequency-division multiplexing (OFDM) waveform. In some implementations, the first data is encoded in phase difference between two consecutive resource elements (REs) in a frequency domain.

The UE 115 may execute, under control of controller/processor 280, Non-Coherent logic 802, stored in memory 282. The execution environment of Non-Coherent logic 802 provides the functionality for UE 115 to define and perform the non-coherent encoding and decoding procedures. Additionally, the UE 115 may execute one or more of mmWave logic 803 and or coherent logic 804. The execution environment of Non-Coherent logic 802 (and optionally mmWave logic 803) defines the different non-coherent encoding and decoding processes, such as determining to perform non-coherent encoding/decoding, performing the non-coherent encoding/decoding, adjusting non-coherent encoding/decoding settings, or a combination thereof. To illustrate, UE 115 may determine to operate in a particular non-coherent encoding/decoding mode based on a configuration message.

At block 601B, the UE 115 transmits the first transmission that is non-coherently encoded. For example, the UE 115 sends a transmission, such as 352-356, via wireless radios 800a-r and antennas 252a-r, and the transmission was non-coherently encoded, such as generated independent of channel state information. The transmission, such as a waveform thereof, may be referred to as a non-coherent transmissions or non-coherent waveform. Additionally, such non-coherent transmissions and waveforms are often referred to as differential transmissions or waveforms. The transmission may include multiple slots or may be one of multiple transmissions for a set of contiguous slots of a window or frame. In some implementations, each slot is allocated to or for downlink transmissions. In other implementations, the slots include uplink and downlink slots. Additionally, or alternatively, every N number of slots includes a downlink centric slot. A downlink centric slot may include control information, data information (e.g., user data information), acknowledgment information, or a combination thereof.

In some implementations, performing the non-coherent encoding operation includes performing the non-coherent encoding operation independent of a DMRS hardware buffer, a symbol hardware buffer, or both. To illustrate, as the symbols are differentially encoded and the data is encoded in phase difference between adjacent or consecutive symbols, a reference signal buffer may not be utilized during encoding (or decoding). Performing the non-coherent encoding operation enables phase noise reduction for low to mid-rate modulation and coding scheme (MCS), such a single layer mode modulation modes.

The wireless communication device may execute additional blocks (or the wireless communication device may be configured further perform additional operations) in other implementations. For example, the wireless communication device may perform one or more operations described above. To illustrate, the wireless communication device may perform one or more aspects as described with reference to FIG. 6A.

Figures 6C, 7C:
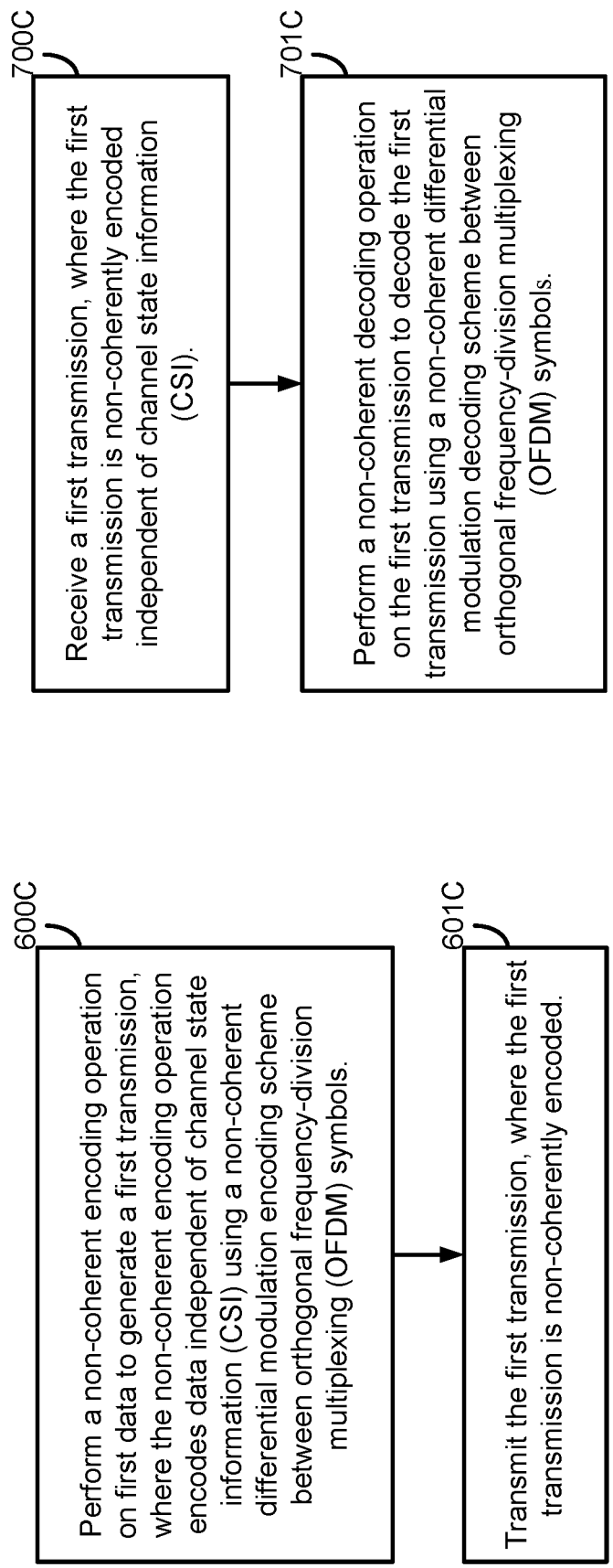
FIG. 6C is a block diagram illustrating example blocks executed by a wireless communication device configured according to an aspect of the present disclosure.
FIG. 7C is a block diagram illustrating example blocks executed by a wireless communication device configured according to an aspect of the present disclosure.

FIG. 6C is a block diagram illustrating example blocks executed by a UE configured according to an aspect of the present disclosure. The example blocks will also be described with respect to UE 115 as illustrated in FIG. 8. However, another wireless communication device, such as network entity (e.g., base station 105), may execute such blocks in other implementations.

At block 600C, a mobile communication device, such as a UE, performs a non-coherent encoding operation on first data to generate a first transmission using a non-coherent differential modulation encoding scheme between orthogonal frequency-division multiplexing (OFDM) symbols. For example, the UE 115 performs a non-coherent encoding operation as described in FIG. 3 or 4A. The non-coherent encoding operation may be performed independent of channel state information (CSI) using a non-coherent differential modulation encoding scheme between orthogonal frequency-division multiplexing (OFDM) symbols. In some implementations, the first data is encoded in phase difference between two consecutive resource elements (REs) in a time domain belonging to two adjacent OFDM symbols.

The UE 115 may execute, under control of controller/processor 280, Non-Coherent logic 802, stored in memory 282. The execution environment of Non-Coherent logic 802 provides the functionality for UE 115 to define and perform the non-coherent encoding and decoding procedures. Additionally, the UE 115 may execute one or more of mmWave logic 803 and or coherent logic 804. The execution environment of Non-Coherent logic 802 (and optionally mmWave logic 803) defines the different non-coherent encoding and decoding processes, such as determining to perform non-coherent encoding/decoding, performing the non-coherent encoding/decoding, adjusting non-coherent encoding/decoding settings, or a combination thereof. To illustrate, UE 115 may determine to operate in a particular non-coherent encoding/decoding mode based on a configuration message.

At block 601C, the UE 115 transmits the first transmission that is non-coherently encoded. For example, the UE 115 sends a transmission, such as 352-356, via wireless radios 800a-r and antennas 252a-r, and the transmission was non-coherently encoded, such as generated independent of channel state information. The transmission, such as a waveform thereof, may be referred to as a non-coherent transmissions or non-coherent waveform. Additionally, such non-coherent transmissions and waveforms are often referred to as differential transmissions or waveforms. The transmission may include multiple slots or may be one of multiple transmissions for a set of contiguous slots of a window or frame. In some implementations, each slot is allocated to or for downlink transmissions. In other implementations, the slots include uplink and downlink slots. Additionally, or alternatively, every N number of slots includes a downlink centric slot. A downlink centric slot may include control information, data information (e.g., user data information), acknowledgment information, or a combination thereof.

In some implementations, performing the non-coherent encoding operation includes performing the non-coherent encoding operation independent of a DMRS hardware buffer, a symbol hardware buffer, or both. To illustrate, as the symbols are differentially encoded and the data is encoded in phase difference between adjacent or consecutive symbols, a reference signal buffer may not be utilized during encoding (or decoding). Performing the non-coherent encoding operation enables phase noise reduction for low to mid-rate modulation and coding scheme (MCS), such a single layer mode modulation modes.

The wireless communication device may execute additional blocks (or the wireless communication device may be configured further perform additional operations) in other implementations. For example, the wireless communication device may perform one or more operations described above. To illustrate, the wireless communication device may perform one or more aspects as described with reference to FIG. 6A.

Figure 9:
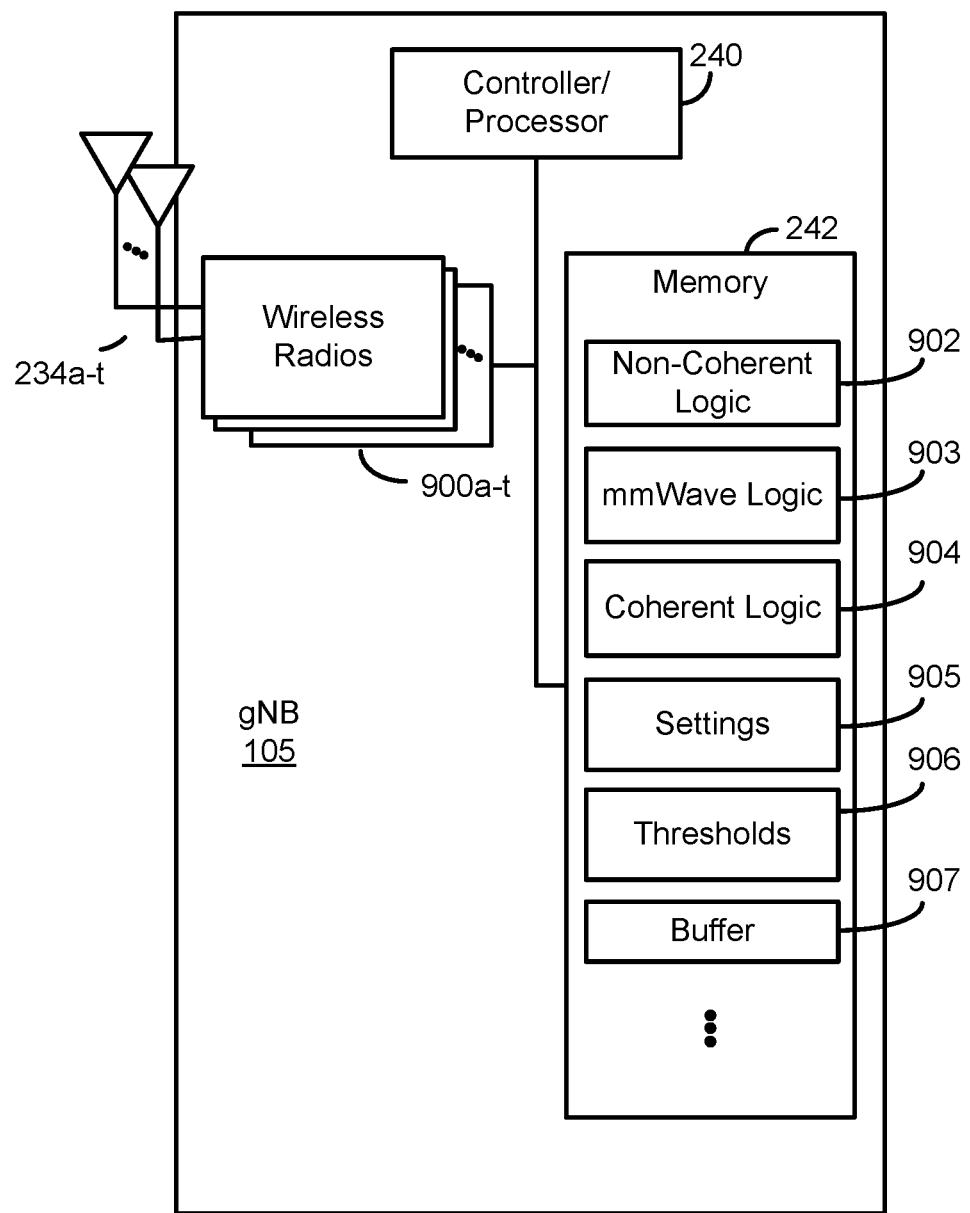
FIG. 9 is a block diagram conceptually illustrating a design of a network entity according to some embodiments of the present disclosure.

FIG. 7A is a block diagram illustrating example blocks executed by a wireless communication device configured according to an aspect of the present disclosure. The example blocks will also be described with respect to a network entity, such as gNB 105 as illustrated in FIG. 9. However, another wireless communication device, such as UE 115, may execute such blocks in other implementations.

Referring to FIG. 9, FIG. 9 is a block diagram illustrating a base station 105 configured according to one aspect of the present disclosure. Base station 105 includes the structure, hardware, and components as illustrated for base station 105 of FIG. 2. For example, base station 105 includes controller/processor 240, which operates to execute logic or computer instructions stored in memory 242, as well as controlling the components of base station 105 that provide the features and functionality of base station 105. Base station 105, under control of controller/processor 280, transmits and receives signals via wireless radios 900a-t and antennas 234a-t. Wireless radios 900a-t includes various components and hardware, as illustrated in FIG. 2 for base station 105, including modulator/demodulators 232a-t, MIMO detector 236, receive processor 238, transmit processor 220, and TX MIMO processor 230. As illustrated in the example of FIG. 9, memory 242 stores Non-Coherent logic 902, mmWave logic 903, Coherent logic 904, Settings 905, Thresholds 906, and Buffer 907.

At block 700A, a wireless communication device, such as a gNB 105, receives a first transmission that is non-coherently encoded. For example, the gNB 105 receives a transmission, as in FIG. 3, that was non-coherently encoded.

At block 701A, the gNB 105 performs a non-coherent decoding operation on the first transmission to decode the first transmission. For example, the gNB 105 performs a non-coherent decoding operation as described in FIG. 3 or 5. The non-coherent decoding operation may be performed independent of channel state information (CSI).

The wireless communication device (e.g., gNB 105 or UE 115) may execute additional blocks (or the wireless communication device may be configured further perform additional operations) in other implementations. For example, the wireless communication device may perform one or more operations described above. As another example, the wireless communication device may perform one or more aspects as described below.

In a first aspect, performing the non-coherent decoding operation includes: removing a cyclic prefix from OFDM symbols and performing fast Fourier transform (FFT) operations to generate differentially encoded symbols; differential decoding the differentially encoded symbols to generate channel encoded bits; performing least significant bit (LSB) channel decoding on the channel encoded bits to generate partially decoded bits; and performing most significant bit (MSB) channel decoding on the partially decoded bits to generate decoded bits.

In a second aspect, alone or in combination with the first aspect, performing the non-coherent decoding operation includes: removing a cyclic prefix from OFDM symbols and performing fast Fourier transform (FFT) operations to generate differentially encoded symbols; differential decoding the differentially encoded symbols to generate channel encoded bits; and performing a single channel decoding on the channel encoded bits to generate decoded bits.

In a third aspect, alone or in combination with one or more of the above aspects, the first transmission corresponds to a millimeter wave transmission.

In a fourth aspect, alone or in combination with one or more of the above aspects, performing the non-coherent decoding operation includes: multiplying a resource element with a conjugate of an adjacent resource element.

In a fifth aspect, alone or in combination with one or more of the above aspects, performing the non-coherent decoding operation includes: dividing a resource element by an adjacent resource element.

In a sixth aspect, alone or in combination with one or more of the above aspects, the wireless communication device is a user equipment or a network entity.

In a seventh aspect, alone or in combination with one or more of the above aspects, the first data is decoded in phase difference between two consecutive resource elements (REs) in a frequency domain.

In an eighth aspect, alone or in combination with one or more of the above aspects, the first data is decoded in phase difference between two consecutive resource elements (REs) in a time domain belonging to two adjacent OFDM symbols.

In a ninth aspect, alone or in combination with one or more of the above aspects, the performing the non-coherent decoding operation comprises decoding based on a phase shift keying based modulation scheme or an amplitude and phase shift keying based modulation scheme.

In a tenth aspect, alone or in combination with one or more of the above aspects, the performing the non-coherent decoding operation comprises decoding based on an amplitude difference modulation scheme.

FIG. 7B is a block diagram illustrating example blocks executed by a wireless communication device configured according to an aspect of the present disclosure. The example blocks will also be described with respect to a network entity, such as gNB 105 as illustrated in FIG. 9. However, another wireless communication device, such as UE 115, may execute such blocks in other implementations.

At block 700B, a wireless communication device, such as a gNB 105, receives a first transmission that is non-coherently encoded. For example, the gNB 105 receives a transmission, as in FIG. 3, that was non-coherently encoded.

At block 701B, the gNB 105 performs a non-coherent decoding operation on the first transmission to decode the first transmission using a non-coherent differential modulation decoding scheme in a frequency domain for adjacent subcarriers in an orthogonal frequency-division multiplexing (OFDM) waveform. For example, the gNB 105 performs a non-coherent decoding operation as described in FIG. 3 or 5. The non-coherent decoding operation may be performed independent of channel state information (CSI) using a non-coherent differential modulation decoding scheme in the frequency domain for adjacent subcarriers in an orthogonal frequency-division multiplexing (OFDM) waveform.

The wireless communication device may execute additional blocks (or the wireless communication device may be configured further perform additional operations) in other implementations. For example, the wireless communication device may perform one or more operations described above. To illustrate, the wireless communication device may perform one or more aspects as described with reference to FIGS. 6A and 7A.

FIG. 7C is a block diagram illustrating example blocks executed by a wireless communication device configured according to an aspect of the present disclosure. The example blocks will also be described with respect to a network entity, such as gNB 105 as illustrated in FIG. 9. However, another wireless communication device, such as UE 115, may execute such blocks in other implementations.

At block 700C, a wireless communication device, such as a gNB 105, receives a first transmission that is non-coherently encoded. For example, the gNB 105 receives a transmission, as in FIG. 3, that was non-coherently encoded.

At block 701C, the gNB 105 performs a non-coherent decoding operation on the first transmission to decode the first transmission using a non-coherent differential modulation decoding scheme between orthogonal frequency-division multiplexing (OFDM) symbols. For example, the gNB 105 performs a non-coherent decoding operation as described in FIG. 3 or 5. The non-coherent decoding operation may be performed independent of channel state information (CSI) using a non-coherent differential modulation decoding scheme between orthogonal frequency-division multiplexing (OFDM) symbols.

The wireless communication device may execute additional blocks (or the wireless communication device may be configured further perform additional operations) in other implementations. For example, the wireless communication device may perform one or more operations described above. To illustrate, the wireless communication device may perform one or more aspects as described with reference to FIGS. 6A and 7A.

Accordingly, a wireless communication device, such as a UE or a base station, may non-coherently encode and decode information for wireless communication. By utilizing non-coherently encoded communications, improved transmission and reception can be achieved. For example, wireless communication devices may use less power to transmit and receive such communications and/or use less power to encode and decode information to be transmitted. Additionally, such non-coherently encoded communications may reduce costs and may increase device mobility. For example, the processing for non-coherent encoding is more simplified as compared to coherent encoding. Thus, the processing power costs are reduced, and device costs may be reduced. To illustrate, battery size and processing power/a processing chain may be reduced. As an illustrative example, the device may not utilize a hardware based buffer and/or may utilize a two symbol buffer. As another example, non-coherently encoded transmissions are more resistant to the Doppler effect (e.g., frequency changes based on device movement). Additionally, the usage of both demodulation reference signal (DMRS) and TRS pilot signals may be redundant; transmission overhead may be reduced. To illustrate, TRS pilots may be not used and DMRS may be used in more limited ways, such as for coding gain and in repurposed or vacant REs instead of in dedicated DMRS REs. Consequently, latency and overhead may be reduced and throughput and reliability may be increased.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The functional blocks and modules described herein (e.g., the functional blocks and modules in FIG. 2) may comprise processors, electronics devices, hardware devices, electronics components, logical circuits, memories, software codes, firmware codes, etc., or any combination thereof. In addition, features discussed herein relating to non-coherent coding may be implemented via specialized processor circuitry, via executable instructions, and/or combinations thereof.

Those of skill would further appreciate that the various illustrative logical blocks, modules, circuits, and algorithm steps (e.g., the logical blocks in FIGS. 6A-6C and 7A-7C) described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in random access memory (RAM), read-only memory (ROM), electronically erasable programmable read-only memory (EEPROM), registers, a hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Computer-readable storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, a connection may be properly termed a computer-readable medium. For example, if the software is transmitted from a website, server, or other remote source using a coaxial cable, fiber optic cable, twisted pair, or digital subscriber line (DSL), then the coaxial cable, fiber optic cable, twisted pair, or DSL, are included in the definition of medium. Disk and disc, as used herein, includes compact disc (CD), laser disc, optical disc, digital versatile disc (DVD), hard disk, solid state disk, and blu-ray disc where disks usually reproduce data magnetically, while discs reproduce data optically with lasers. Combinations of the above should also be included within the scope of computer-readable media.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C) or any of these in any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication comprising:
performing, by a wireless communication device, a non-coherent encoding operation on first data to generate a first transmission, wherein the non-coherent encoding operation encodes data independent of channel state information (CSI) using a non-coherent differential modulation encoding scheme in a frequency domain for adjacent subcarriers in an orthogonal frequency-division multiplexing (OFDM) waveform; and transmitting, by the wireless communication device, the first transmission, wherein the first transmission is non-coherently encoded and corresponds to a millimeter wave transmission, and wherein the first data is encoded in phase difference between two consecutive resource elements (REs) in the frequency domain.

2. The method of claim 1, wherein the OFDM waveform includes multiple REs including the two consecutive, wherein a resource element of the multiple REs corresponds to one or more OFDM symbols.

3. The method of claim 1, wherein the performing the non-coherent encoding operation comprises encoding based on a phase shift keying based modulation scheme or an amplitude and phase shift keying based modulation scheme.

4. The method of claim 1, wherein the performing the non-coherent encoding operation comprises encoding based on an amplitude difference modulation scheme.

5. The method of claim 1, wherein the wireless communication device operates according to a slot format, and wherein each slot is allocated to downlink transmissions.

6. The method of claim 1, wherein the wireless communication device operates according to a slot format, and wherein every N number of slots includes a downlink centric slot.

7. The method of claim 1, wherein performing the non-coherent encoding operation comprises performing the non-coherent encoding operation independent of tracking reference signal (TRS) pilots.

8. The method of claim 1, wherein performing the non-coherent encoding operation comprises utilizing REs allocated for demodulation reference signal (DMRS) as data conveying REs for higher coding gain.

9. The method of claim 1, wherein performing the non-coherent encoding operation includes:
multiplying two adjacent symbols for a particular resource element to generate a product; and
mapping the particular resource element to the product of the multiplication of the two adjacent symbols.

10. The method of claim 1, wherein performing the non-coherent encoding operation includes:
mapping a first resource element to a stored value.

11. The method of claim 1, wherein performing the non-coherent encoding operation includes:
performing set partitioning of information bits of the first data to generate multiple bit streams;
performing channel coding on each bit stream of the multiple bit streams to generate corresponding channel coded bits;
performing bits to symbol mapping on each channel coded bits to generate corresponding symbols;
performing differential encoding on each symbol to generate differentially encoded symbols; and
performing inverse fast Fourier transform (IFFT) and cyclic prefix (CP) operations on the differentially encoded symbols to generate OFDM symbols.

12. The method of claim 11, wherein each fast Fourier transform (FFT) symbol is encoded independent of other FFT symbols.

13. The method of claim 1, wherein performing the non-coherent encoding operation includes:
mapping a first resource element (RE) of multiple resource elements (REs) of the OFDM waveform to a stored value; and
mapping a second resource element of the multiple REs to a product of a conjugate multiplication of the second resource element and a conjugate of the first resource element, wherein the multiple REs belong to one OFDM symbol of the OFDM waveform.

14. An apparatus configured for wireless communication, the apparatus comprising:
at least one processor; and
a memory coupled to the processor, the processor is configured:
to perform, by a wireless communication device, a non-coherent encoding operation on first data to generate a first transmission, wherein the non-coherent encoding operation encodes data independent of channel state information (CSI) using a non-coherent differential modulation encoding scheme in a frequency domain for adjacent subcarriers in an orthogonal frequency-division multiplexing (OFDM) waveform; and
to transmit, by the wireless communication device, the first transmission, wherein the first transmission is non-coherently encoded and corresponds to a millimeter wave transmission, and wherein the first data is encoded in phase difference between two consecutive resource elements (REs) in the frequency domain.

15. The apparatus of claim 14, wherein performing the non-coherent encoding operation comprises repurposing unused resource elements for data.

16. The apparatus of claim 14, wherein performing the non-coherent encoding operation comprises performing the non-coherent encoding operation independent of channel estimation.

17. The apparatus of claim 14, wherein performing the non-coherent encoding operation comprises performing the non-coherent encoding operation independent of channel equalization.

18. The apparatus of claim 14, wherein performing the non-coherent encoding operation comprises performing the non-coherent encoding operation independent of a demodulation reference signal (DMRS).

19. The apparatus of claim 14, wherein performing the non-coherent encoding operation comprises performing the non-coherent encoding operation independent of a demodulation reference signal (DMRS) hardware buffer, a symbol hardware buffer, or both.

20. The apparatus of claim 14, wherein performing the non-coherent encoding operation enables phase noise reduction for low to mid-rate modulation and coding scheme (MCS).

21. The apparatus of claim 14, wherein the wireless communication device is a user equipment or a network entity.

22. The apparatus of claim 21, wherein the user equipment is a reduced capability user equipment with a single receive antenna.

23. The apparatus of claim 14, wherein performing the non-coherent encoding operation comprises performing the non-coherent encoding operation independent of spatial multiplexing.

24. A method of wireless communication comprising:
receiving, by a wireless communication device, a first transmission, wherein the first transmission is non-coherently encoded independent of channel state information (CSI) and corresponds to a millimeter wave transmission, and wherein first data of the first transmission is encoded in phase difference between two consecutive resource elements (REs) in a frequency domain; and performing, by the wireless communication device, a non-coherent decoding operation on the first transmission to decode the first transmission using a non-coherent differential modulation decoding scheme in the frequency domain for adjacent subcarriers in an orthogonal frequency-division multiplexing (OFDM) waveform.

25. The method of claim 24, wherein performing the non-coherent decoding operation includes:
removing a cyclic prefix from OFDM symbols and performing fast Fourier transform (FFT) operations to generate differentially encoded symbols;
differential decoding the differentially encoded symbols to generate channel encoded bits;
performing least significant bit (LSB) channel decoding on the channel encoded bits to generate partially decoded bits; and
performing most significant bit (MSB) channel decoding on the partially decoded bits to generate decoded bits.

26. The method of claim 24, wherein performing the non-coherent decoding operation includes:
removing a cyclic prefix from OFDM symbols and performing fast Fourier transform (FFT) operations to generate differentially encoded symbols;
differential decoding the differentially encoded symbols to generate channel encoded bits; and
performing a single channel decoding on the channel encoded bits to generate decoded bits.

27. An apparatus configured for wireless communication, the apparatus comprising:
at least one processor; and
a memory coupled to the processor, the processor is configured:
to receive, by a wireless communication device, a first transmission, wherein the first transmission is non-coherently encoded independent of channel state information (CSI) and corresponds to a millimeter wave transmission, and wherein first data of the first transmission is encoded in phase difference between two consecutive resource elements (REs) in a frequency domain; and
to perform, by the wireless communication device, a non-coherent decoding operation on the first transmission to decode the first transmission using a non-coherent differential modulation decoding scheme in the frequency domain for adjacent subcarriers in an orthogonal frequency-division multiplexing (OFDM) waveform.

28. The apparatus of claim 27, wherein performing the non-coherent decoding operation includes:
multiplying a resource element with a conjugate of an adjacent resource element.

29. The apparatus of claim 27, wherein performing the non-coherent decoding operation includes:
dividing a resource element by an adjacent resource element.

30. The apparatus of claim 27, wherein the wireless communication device is a user equipment or a network entity.

* * * * *